(12) United States Patent
Huang et al.

(10) Patent No.: US 11,508,755 B2
(45) Date of Patent: Nov. 22, 2022

(54) STACKED FERROELECTRIC STRUCTURE

(71) Applicant: Taiwan Semiconductor Manufacturing Co., Ltd., Hsinchu (TW)

(72) Inventors: Rainer Yen-Chieh Huang, Hsinchu (TW); Hai-Ching Chen, Hsinchu (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/184,856

(22) Filed: Feb. 25, 2021

(65) Prior Publication Data
US 2022/0271046 A1 Aug. 25, 2022

(51) Int. Cl.
*H01L 27/11* (2006.01)
*H01L 29/51* (2006.01)
(Continued)

(52) U.S. Cl.
CPC .... *H01L 27/1159* (2013.01); *H01L 29/40111* (2019.08); *H01L 29/516* (2013.01); *H01L 29/6684* (2013.01); *H01L 29/78391* (2014.09)

(58) Field of Classification Search
CPC ........... H01L 27/1159; H01L 29/40111; H01L 29/516; H01L 29/6684; H01L 29/78391
(Continued)

(56) References Cited

U.S. PATENT DOCUMENTS

2008/0025063 A1* 1/2008 Kang ............... G11C 11/22
257/E21.663
2009/0267122 A1* 10/2009 Ohmi ............... H01L 21/02197
257/295
(Continued)

OTHER PUBLICATIONS

Onaya et al. "Improvement in ferroelectricity of HfxZr1—xO2 thin films using top- and bottom-ZrO2 nucleation layers" APL Mater. 7, 061107 (2019), published on Jun. 27, 2019.
(Continued)

*Primary Examiner* — Sheikh Maruf
(74) *Attorney, Agent, or Firm* — Eschweiler & Potashnik, LLC

(57) ABSTRACT

The present disclosure relates to an integrated circuit (IC) in which a memory structure comprises a ferroelectric structure without critical-thickness limitations. The memory structure comprises a first electrode and the ferroelectric structure. The ferroelectric structure is vertically stacked with the first electrode and comprises a first ferroelectric layer, a second ferroelectric layer, and a first restoration layer. The second ferroelectric layer overlies the first ferroelectric layer, and the first restoration layer is between and borders the first and second ferroelectric layers. The first restoration layer is a different material type than that of the first and second ferroelectric layers and is configured to decouple crystalline lattices of the first and second ferroelectric layers so the first and second ferroelectric layers do not reach critical thicknesses. A critical thickness corresponds to a thickness at and above which the orthorhombic phase becomes thermodynamically unstable, such that remanent polarization is lost.

20 Claims, 26 Drawing Sheets

(51) Int. Cl.
*H01L 29/78* (2006.01)
*H01L 27/1159* (2017.01)
*H01L 29/66* (2006.01)
*H01L 21/28* (2006.01)

(58) Field of Classification Search
USPC .......................................................... 257/295
See application file for complete search history.

(56) References Cited

U.S. PATENT DOCUMENTS

| | | | | |
|---|---|---|---|---|
| 2014/0070289 | A1* | 3/2014 | Tanaka | H01L 29/40111 257/295 |
| 2014/0070290 | A1* | 3/2014 | Inumiya | H01L 43/10 257/295 |
| 2015/0171183 | A1* | 6/2015 | Sakai | H01L 29/517 257/295 |
| 2015/0214322 | A1* | 7/2015 | Mueller | H01L 29/6684 257/532 |
| 2015/0340372 | A1* | 11/2015 | Pandey | H01L 29/6684 257/295 |
| 2015/0357429 | A1* | 12/2015 | Dubourdieu | H01L 29/513 257/295 |
| 2016/0035856 | A1* | 2/2016 | van Bentum | H01L 29/516 257/295 |
| 2016/0049302 | A1* | 2/2016 | Grass | H01L 29/66545 257/369 |
| 2016/0064228 | A1* | 3/2016 | van Bentum | H01L 29/78391 257/295 |
| 2016/0071947 | A1* | 3/2016 | Wiatr | H01L 29/516 257/295 |
| 2016/0111549 | A1* | 4/2016 | Baars | H01L 21/28185 257/295 |

OTHER PUBLICATIONS

Onaya et al. "Improvement in ferroelectricity of HfxZr1%xO2 thin films using ZrO2 seed layer" Applied Physics Express 10, 081501 (2017), published on Jul. 13, 2017.

Robertson, J. "Band structures and band offsets of high k dielectrics on Si" Applied Surface Science 10 (2002) 2-10, published in 2002.

Hays et al. "Energy band offsets of dielectrics on InGaZnO4" Applied Physics Reviews 4, 021301 (2017), published on Apr. 18, 2017.

Hays et al. "Band offsets in HfSiO4/IGZO heterojunctions" Journal of Vacuum Science & Technology B, Nanotechnology and Microelectronics: Materials, Processing, Measurement, and Phenomena 33, 061209 (2015), published on Nov. 19, 2015.

Hays et al. "Effect of deposition conditions and composition on band offsets in atomic layer deposited HfxSi1—xOy on InGaZnO4" J. Vac. Sci. Technol. B 35, 011206 (2017), published on Jan. 11, 2017.

Ambriz-Vargas et al. "Ferroelectric (Hf, Zr)O2 Thin Films for High-Density Nonvolatile Memories" Frontiers in Materials Processing, Applications, Research and Technology, Chapter 12: Ferroelectric (Hf, Zr)O2 Thin Films for High-Density Nonvolatile Memories, published in 2018.

\* cited by examiner

STACKED FERROELECTRIC STRUCTURE

BACKGROUND

Many modern-day electronic devices include non-volatile memory. Non-volatile memory is electronic memory that is able to store data in the absence of power. A promising candidate for the next generation of non-volatile memory is ferroelectric random-access memory (FeRAM). FeRAM has a relatively simple structure and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
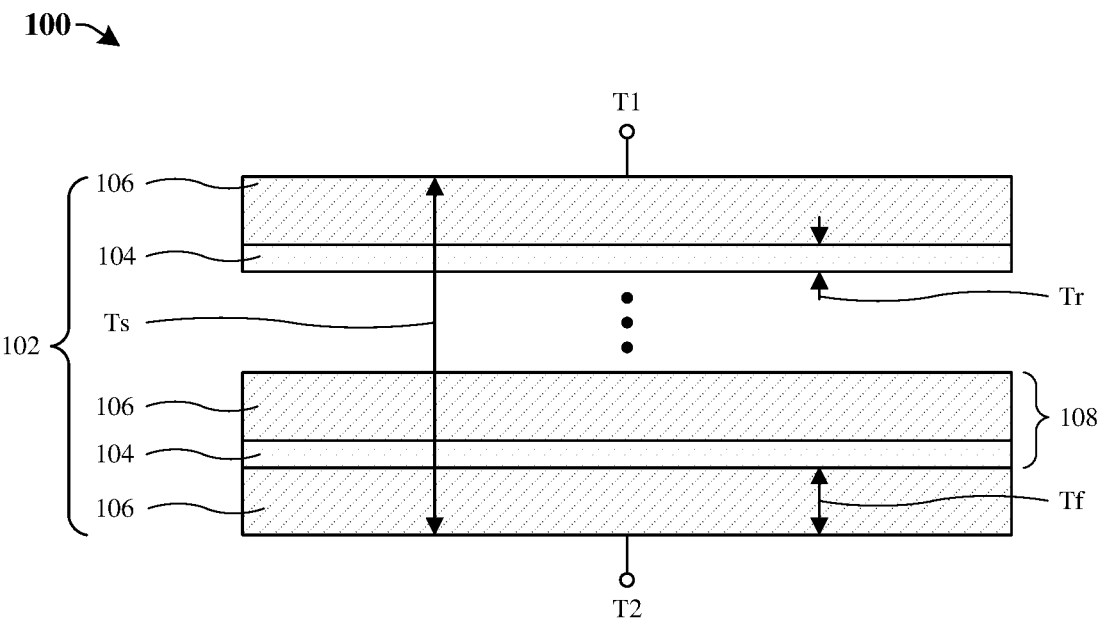
FIG. 1 illustrates a cross-sectional view of some embodiments of a stacked ferroelectric structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Ferroelectric materials are commonly used in memory structures, such as metal-ferroelectric-metal (MFM) structures, metal-ferroelectric-insulator-semiconductor (MFIS) structures, ferroelectric field-effect transistors (FeFETs), and thin film transistors (TFTs). Further, ferroelectric materials have a remanent polarization switchable between a first state and a second state by application of an electric field. Certain ferroelectric materials exhibit polycrystallinity that may determine remanent polarization behavior. Amongst these ferroelectric materials, three main crystalline phases are present: tetragonal, monoclinic, and orthorhombic. Further, amongst these three main crystalline phases, only the orthorhombic phase exhibits remanent polarization. Hence, increasing the ratio of the orthorhombic phase to other phases may increase remanent polarization in the first and second states.

The larger the polarization difference (e.g., 2Pr) between the first and second states, the more resilient read operations are in ferroelectric memory. However, adjusting the polarization difference by the ratio of the orthorhombic phase to other phases is challenging. Therefore, thickness may be used to adjust the polarization difference. Up to a critical thickness, the orthorhombic phase may be thermodynamically stable and may dominate compared to the tetragonal and monoclinic phases. Therefore, increasing thickness up to the critical thickness may increase the polarization difference. However, at and above the critical thickness, the orthorhombic phase may become thermodynamically unstable, such that the tetragonal and/or monoclinic phases may dominate. Hence, at and above the critical thickness, the ratio of the orthorhombic phase to other phases becomes low and the increase in polarization difference from thickness is negated.

In the present disclosure, a stacked ferroelectric structure without critical-thickness limitations, and a method for forming the stacked ferroelectric structure, are proposed. In some embodiments, the stacked ferroelectric structure comprises a lower ferroelectric layer, an upper ferroelectric layer, and a restoration layer. The upper ferroelectric layer overlies the lower ferroelectric layer, and the restoration layer is between and borders the lower and upper ferroelectric layers. The restoration layer provides a break between crystalline lattices respectively of the lower and upper ferroelectric layers, such that a crystalline lattice of the upper ferroelectric layer is not a continuation of and is hence not affected by a crystalline lattice of the lower ferroelectric layer and vice versa. As a result, the ratio of the orthorhombic phase to other phases in the upper ferroelectric layer in not affected by the thickness of the lower ferroelectric layer and vice versa.

Because of the crystalline break provided by the restoration layer, the lower ferroelectric layer may be deposited with a thickness up to a critical thickness of the lower ferroelectric layer and then the upper ferroelectric layer may be deposited with a thickness up to a critical thickness of the upper ferroelectric layer without being affected by the lower ferroelectric layer. The combination of the lower and upper ferroelectric layers and the restoration layer may then have a combined thickness greater than the critical thicknesses respectively of the lower and upper ferroelectric layers. This may, in turn, allow the stacked ferroelectric structure to have a larger polarization difference than would otherwise be possible with a single ferroelectric layer. Further, with additional ferroelectric layers and additional restoration layers, the polarization difference may be even larger.

With reference to FIG. 1, a cross-sectional view 100 of some embodiments of a stacked ferroelectric structure 102 is provided. The stacked ferroelectric structure 102 comprises a plurality of restoration layers 104 and a plurality of ferroelectric layers 106. In some embodiments, the restoration layers 104 may also be known as crystalline bounding layers (or bounding layers for short) or surface reconstruction layers. The ferroelectric layers 106 and the restoration layers 104 are vertically stacked, such that the ferroelectric layers 106 alternate periodically with the restoration layers 104.

The ellipsis is used to represent zero or more additional ferroelectric-layer-restoration-layer pairs 108. Further, while the stacked ferroelectric structure 102 is illustrated with at least three ferroelectric layers 106 and at least two restoration layers 104, the stacked ferroelectric structure 102 may only have one restoration layer 104 and/or only two ferroelectric layers 106 in alternative embodiments.

The ferroelectric layers 106 are polycrystalline and have a plurality of crystalline phases (e.g., crystalline grain types). The plurality of crystalline phases comprises the tetragonal phase, the monoclinic phase, and the orthorhombic phase. In some embodiments, the plurality of crystalline phases further comprises the cubic phase and/or some other suitable crystalline phase(s). Further, the orthorhombic phase dominates in the ferroelectric layers 106. In other words, the orthorhombic phase is a majority phase in the ferroelectric layers 106. The orthorhombic phase, but not the tetragonal phase and the monoclinic phase, exhibits remanent polarization. Therefore, because the orthorhombic phase dominates, the ferroelectric layers 106 have remanent polarizations.

The ferroelectric layers 106 have individual thickness Tf less than individual critical thicknesses. The critical thicknesses correspond to thicknesses at or above which the orthorhombic phase becomes thermodynamically unstable and other phases dominate. For example, the ferroelectric layers 106 may be or comprise hafnium zirconium oxide and may have individual critical thicknesses less than 20-30 nanometers or some other suitable value. Thermodynamic instability may, for example, arise due to crystalline grains becoming too large, such that the individual critical thicknesses may, for example, also correspond to thicknesses at or above which crystalline grains are at or above critical grain sizes. In some embodiments, a majority phase amongst the plurality of phases changes from an orthorhombic phase to a tetragonal and/or monoclinic phase at a critical thickness of a ferroelectric layer 106.

Because the ferroelectric layers 106 have remanent polarizations, the stacked ferroelectric structure 102 has a remanent polarization. Further, by appropriately biasing the stacked ferroelectric structure 102, the remanent polarization may be changed between a first state and a second state. For example, applying a first voltage having a positive polarity from a first terminal T1 at a top of the stacked ferroelectric structure 102 to a second terminal T2 at a bottom terminal of the stacked ferroelectric structure 102 may set the first state. Further, applying a second voltage having a second polarity opposite the first polarity from the first terminal T1 to the second terminal T2 may set the second state.

Because the remanent polarization may be electrically measured, the remanent polarization may be employed to represent a bit of data. For example, the first state may represent a binary "1", whereas the second state may represent a binary "0", or vice versa. Further, the larger the difference (e.g., 2Pr) in remanent polarization between the first state and the second state, the larger the memory read window and hence the more resilient memory read operations are. Because it is the orthorhombic phase that exhibits remanent polarization, increasing the ratio of the orthorhombic phase to other phases may increase the polarization difference. However, adjusting the polarization difference by the ratio is challenging. Thickness may therefore be used to increase the polarization difference.

As described above, the orthorhombic phase becomes thermodynamically unstable when the individual thicknesses Tf of the ferroelectric layers 106 are at or above the individual critical thicknesses, such that the ferroelectric layers 106 lose remanent polarization or have low remanent polarizations. Therefore, if the stacked ferroelectric structure 102 was limited to any one of the ferroelectric layers 106, the stacked ferroelectric structure 102 would itself have a limited thickness. However, because of the restoration layers 104, the stacked ferroelectric structure 102 may have a thickness Ts in excess of the individual critical thicknesses without causing thermodynamic instability and losing remanent polarization.

The restoration layers 104 each provide a break between crystalline lattices of bordering ferroelectric layers 106. As such, the crystalline lattices of the bordering ferroelectric layers 106 are not continuations of each other and hence the ratios of the orthorhombic phase to other phases in the bordering ferroelectric layers 106 are not affected by the individual thicknesses Tf of each other. Put another way, the restoration layers 104 bound the individual thickness Tf of the ferroelectric layers 106 so as to prevent the individual thicknesses Tf from exceeding the critical thicknesses.

Because of the breaks provided by the restoration layers 104, the ferroelectric layers 106 may be formed vertically stacked and may each be formed with individual thicknesses Tf up to the individual critical thicknesses without regard for each other. This, in turn, allows the thickness Ts of the stacked ferroelectric structure 102 to be increased beyond the individual critical thicknesses of the ferroelectric layers 106 by increasing the number of ferroelectric layers 106 and the number of restoration layers 104. Hence, the stacked ferroelectric structure 102 may have a larger difference (e.g., 2Pr) in remanent polarization between the first state and the second state than would otherwise be possible without the restoration layers 104. For example, the difference may be greater than or equal to about 22.1 microcoulomb per centimeter squared (e.g., $\mu C/cm^2$) or some other suitable value.

In some embodiments, the ferroelectric layers 106 share a common material type. In other embodiments, the ferroelectric layers 106 have different material types. In some embodiments, the ferroelectric layers 106 are or comprise hafnium zirconium oxide (e.g., HfZrO) and/or are doped with aluminum (e.g., Al), silicon (e.g., Si), lanthanum (e.g., La), scandium (e.g., Sc), calcium (e.g., Ca), barium (e.g., Ba), gadolinium (e.g., Gd), yttrium (e.g., Y), strontium (e.g., Sr), some other suitable element(s), or any combination of the foregoing to increase remanent polarization. In some embodiments, the ferroelectric layers 106 are or comprise $Hf_xZr_{1-x}O_2$ with x ranging from 0 to 1. For example, the ferroelectric layers 106 may be or comprise $Hf_{0.5}Zr_{0.5}O_2$. In some embodiments, the ferroelectric layers 106 are or comprise aluminum nitride (e.g., AlN) doped with scandium (e.g., Sc) and/or some other suitable element(s). In some embodiments, the ferroelectric layers 106 are or comprise a material with oxygen vacancies. In some embodiments, the ferroelectric layers 106 are some other suitable ferroelectric material. In some embodiments, the ferroelectric layers 106 have a ratio of orthorhombic, tetragonal, and cubic phases to orthorhombic, tetragonal, cubic, and monoclinic phases (e.g., (O+T+C)/(O+T+C+M)) that is greater than about 0.5 or some other suitable value.

In some embodiments, the ferroelectric layers 106 have a combined thickness greater than the individual critical thickness of the ferroelectric layers 106. Further, in some embodiments, the ferroelectric layers 106 have a combined thickness of about 0.1-100 nanometers, about 100-200 nanometers, about 0.1-200 nanometers, or some other suitable value. In some embodiments, the ferroelectric layers 106 have individual thicknesses Tf of about 1-40 nanometers, about 1-20 nanometers, about 20-30 nanometers, about 20-40 nanometers, or some other suitable value. If the individual thicknesses Tf are too large (e.g., greater than about 30 or 40 nanometers or some other suitable value), the orthorhombic phase may be thermodynamically unstable and hence the ferroelectric layers 106 may have low or non-existent remnant polarizations.

In some embodiments, the restoration layers 104 have individual thicknesses Tr of about 0.1-5.0 nanometers, about 1-2 nanometers, or some other suitable value. If the individual thicknesses Tr are too small (e.g., less than about 0.1 nanometers or some other suitable value), the restoration layers 104 may fail to provide a meaningful break between crystalline lattices of bordering ferroelectric layers 106. Hence, the individual thicknesses Tf of the bordering ferroelectric layers 106 may effect each other and lead to thermodynamic instability in the orthorhombic phase, whereby remnant polarization may be degraded.

In some embodiments, the restoration layers 104 are single-layer films. In other embodiments, the restoration layers 104 are multi-layer films. In some embodiments, the restoration layers 104 are crystalline. For example, the restoration layers 104 may be single crystalline, quasi-single crystalline, or polycrystalline. In other embodiments, the restoration layers 104 are amorphous. In some embodiments, the restoration layers 104 have different material types. In other embodiments, the restoration layers 104 have the same material type.

In some embodiments, the restoration layers 104 comprise one or more metal oxides, silicon oxide (e.g., $SiO_2$), one or more other suitable materials, or any combination of the foregoing, and/or the restoration layers 104 are in the cubic phase, the tetragonal phase, the orthorhombic phase, or any combination of the foregoing. The one or more metal oxides may, for example, be or comprise zirconium oxide ($ZrO_2$), yttrium oxide (e.g., $Y_2O_3$), hafnium oxide (e.g., $HfO_2$), aluminum oxide (e.g., $Al_2O_3$), hafnium zirconium oxide (e.g., $Hf_xZr_{1-x}O_y$, where x is 0-1 and y is greater than 0), some other suitable metal oxide, or any combination of the foregoing. In some embodiments, the restoration layers 104 are ferroelectric materials. For example, the restoration layers 104 may be or comprise zirconium oxide crystallized to the orthorhombic phase.

In some embodiments, the restoration layers 104 promote the orthorhombic phase in the ferroelectric layers 106 and/or inhibit the monoclinic phase in the ferroelectric layers 106. For example, the restoration layers 104 may have crystalline lattices dominated by the orthorhombic phase and may serve as seed layers for epitaxial growth of the ferroelectric layers 106. Because the crystalline lattices of the restoration layers 104 are dominated by the orthorhombic phase, the crystalline lattices of the restoration layers 104 promote the orthorhombic phase in the ferroelectric layers 106 during epitaxial growth.

Figure 2:
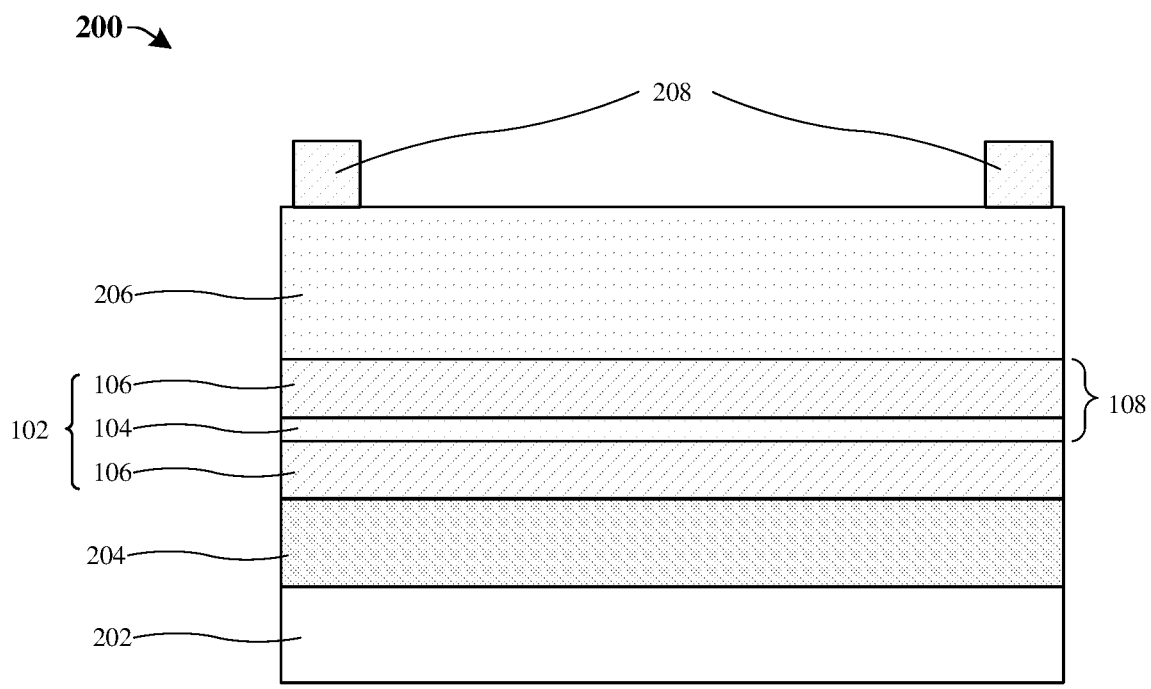
FIG. 2 illustrates a cross-sectional view of some embodiments of an integrated circuit (IC) in which a bottom gate ferroelectric field-effect transistor (FeFET) structure comprises a stacked ferroelectric structure.

With reference to FIG. 2, a cross-sectional view 200 of some embodiments of an integrated circuit (IC) in which a bottom gate FeFET structure comprises a stacked ferroelectric structure 102 is provided. The stacked ferroelectric structure 102 is as described with regard to FIG. 1, except that it has a pair of ferroelectric layers 106 and a single restoration layer 104 between the ferroelectric layers 106. In alternative embodiments, the stacked ferroelectric structure 102 has one or more additional ferroelectric-layer-restoration-layer pairs 108.

A substrate 202 and a bottom electrode 204 are vertically stacked and underlie the stacked ferroelectric structure 102. Further, the bottom electrode 204 separates the substrate 202 from the stacked ferroelectric structure 102. A semiconductor channel layer 206 overlies the stacked ferroelectric structure 102, and a pair of source/drain contacts 208 overlies the semiconductor channel layer 206. Further, the source/drain contacts 208 are disposed on opposite sides of a top surface of the semiconductor channel layer 206.

During operation of the bottom gate FeFET structure, the remanent polarization of the stacked ferroelectric structure 102 is employed to represent a bit of data. A first state of the remanent polarization may represent a binary 1, whereas a second state of the remanent polarization may represent a binary 0, or vice versa.

To write to the bottom gate FeFET structure, a set voltage or a reset voltage is applied from the bottom electrode 204 to the semiconductor channel layer 206 (e.g., via the source/drain contacts 208). The set and reset voltages have opposite polarities and magnitudes in excess of a coercive voltage of the stacked ferroelectric structure 102. The set voltage sets the remanent polarization of the stacked ferroelectric structure 102 to the first state, whereas the reset voltage sets the remanent polarization to second state, or vice versa.

To read from the bottom gate FeFET structure, a read voltage less than the coercive voltage of the stacked ferroelectric structure 102 is applied from the bottom electrode 204 to a source one of the source/drain contacts 208. Depending on whether the semiconductor channel layer 206 conducts, the remanent polarization is in the first or second state.

More particularly, because the bottom gate FeFET structure is a FET, the semiconductor channel layer 206 selectively conducts depending upon whether a voltage applied to the bottom electrode 204 exceeds a threshold voltage. Further, the stacked ferroelectric structure 102 changes the threshold voltage based on a state of the remanent polarization. Therefore, the semiconductor channel layer 206 conducts based on the state of the remanent polarization when the read voltage is between the different threshold voltage states.

In some embodiments, the substrate 202 comprises a semiconductor substrate and a dielectric layer covering the semiconductor substrate. The semiconductor substrate may, for example, be or comprise a monocrystalline silicon substrate, a silicon-on-insulator (SOI) substrate, a polymer substrate, or some other suitable type of semiconductor substrate. In some embodiments, the semiconductor substrate has a P-type doping type or some other suitable doping type. The dielectric layer may be or comprise, for example, silicon oxide (e.g., $SiO_2$) and/or some other suitable dielectric(s).

In some embodiments, the source/drain contacts 208 are or comprise copper, gold, some other suitable conductive material(s), or any combination of the foregoing. In some embodiments, the bottom electrode 204 is or comprises titanium nitride (e.g., TiN), tantalum nitride (e.g., TaN), platinum (e.g., Pt), titanium (e.g., Ti), tantalum (e.g., Ta) tungsten (e.g., W), iron (e.g., Fe), nickel (e.g., Ni), beryllium (e.g., Be), chromium (e.g., Cr), cobalt (e.g., Co), antimony (e.g., Sb), iridium (e.g., Jr), molybdenum (e.g., Mo), osmium (e.g., Os), thorium (e.g., Th), vanadium (e.g., V), some other suitable metal(s), or any alloy or combination of the foregoing. In some embodiments, the bottom electrode 204 has a thickness of about 15 nanometers, about 15-500 nanometers, or some other suitable thickness. In some embodiments, the bottom electrode 204 has a smaller coefficient of thermal expansion than an immediately overlying layer (e.g., a bottom one of the ferroelectric layers 106), such that the bottom electrode 204 applies tensile stress on the immediately overlying layer.

In some embodiments, the semiconductor channel layer 206 is or comprises amorphous Indium-Gallium-Zinc-Oxide (a-IGZO) and/or some other suitable material, and/or has a thickness of about 10 nanometers or some other suitable value. In some embodiments, the semiconductor channel layer 206 is or comprises silicon, silicon germanium, a group III-V material, a group II-VI material, some other suitable semiconductor material, or any combination of the foregoing. The group III-V material may, for example, be or comprise gallium arsenide (e.g., GaAs), gallium arsenide indium (e.g., GaAsIn), some other suitable group III-V material, or any combination of the foregoing. The group II-VI material may, for example, be or comprise zinc oxide (e.g., ZnO), magnesium oxide (e.g., MgO), gadolinium oxide (e.g., GdO), some other suitable II-VI material, or any combination of the foregoing.

With reference to FIGS. 3A-3G, cross-sectional views 300A-300E of some alternative embodiments of the IC of FIG. 2 are provided in which the bottom gate FeFET structure is varied.

Figure 3A:
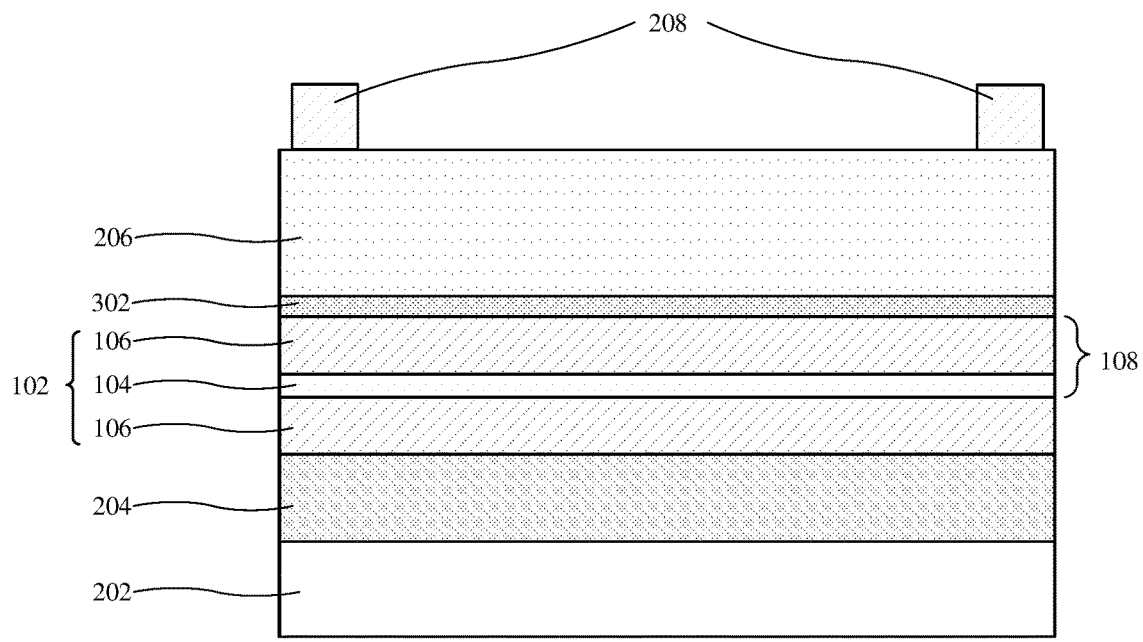
FIGS. 3A-3G illustrate cross-sectional views of some alternative embodiments of the IC of FIG. 2 in which the bottom gate FeFET structure is varied.

In FIG. 3A, the bottom gate FeFET structure further comprises a channel-bottom blocking layer 302 disposed vertically between the semiconductor channel layer 206 and the stacked ferroelectric structure 102. The channel-bottom blocking layer 302 inhibits oxygen vacancies and/or leakage current. The reduced oxygen vacancies inhibit scattering of current in the semiconductor channel layer 206 and/or reduce reliability issues from negative bias temperature instability and positive bias temperature instability.

The channel-bottom blocking layer 302 has smaller valence band than the semiconductor channel layer 206 and has a large valence band offset relative to the semiconductor channel layer 206 to reduce hole leakage current. Additionally, or alternatively, the channel-bottom blocking layer 302 has higher conduction band than the semiconductor channel layer 206 and has a large conduction band offset relative to the semiconductor channel layer 206 to reduce electron leakage current. The large valence band offset is a valence band offset greater than that between the semiconductor channel layer 206 and a top one of the ferroelectric layers 106. Further, the large valence band offset may, for example, be a valence band offset greater than about 0.4 electron volts (eV), 1 eV, or some other suitable value. If the large valence band offset is too small (e.g., less than about 0.4 eV or some other suitable value), leakage current may be high. The large conduction band offset is a conduction band offset greater than that between the semiconductor channel layer 206 and the top one of the ferroelectric layers 106. Further, the large conduction band offset may, for example, be a conduction band offset greater than about 2.7 eV, 3 eV, or some other suitable value. If the large conduction band offset is too small (e.g., less than about 2.7 eV or some other suitable value), leakage current may be high.

In some embodiments, the channel-bottom blocking layer 302 has a thickness of about 0.1 to 10 nanometers or some other suitable value. In some embodiments, the channel-bottom blocking layer 302 is or comprises a bulk material with or without dopants. The bulk material may, for example, be or comprise hafnium oxide (e.g., $HfO_2$), tantalum oxide (e.g., $Ta_2O_5$), some other suitable material, or any combination of the foregoing. The dopants may, for example, be or comprise silicon (e.g., Si), magnesium (e.g., Mg), aluminum (e.g., Al), yttrium oxide (e.g., $Y_2O_3$), lanthanum (e.g., La), strontium (e.g., Sr), gadolinium (e.g., Gd), nitrogen (e.g., N), scandium (e.g., Sc), calcium (e.g., Ca), some other suitable material, or any combination of the foregoing. In some embodiments, the channel-bottom blocking layer 302 is or comprises hafnium oxide (e.g., $HfO_2$) doped with silicon. An atomic percentage of silicon may, for example, be greater than about 10%, about 10-30%, about 30-60%, about 60-90%, or some other suitable percentage. In some embodiments, the channel-bottom blocking layer 302 is or comprises silicon (e.g., Si), magnesium (e.g., Mg), aluminum (e.g., Al), yttrium oxide (e.g., $Y_2O_3$), lanthanum (e.g., La), strontium (e.g., Sr), gadolinium (e.g., Gd), nitrogen (e.g., N), scandium (e.g., Sc), calcium (e.g., Ca), some other suitable material, or any combination of the foregoing.

In some embodiments, the ferroelectric layers 106 are or comprise hafnium oxide (e.g., $HfO_2$), the semiconductor channel layer 206 is or comprises indium gallium zinc oxide (e.g., $InGaZnO_4$), and the channel-bottom blocking layer 302 is or comprises silicon doped hafnium oxide (e.g., $Si:HfO_2$). In at least some of such embodiments, hole leakage current may be high without the channel-bottom blocking layer 302 because the valence band offset between hafnium oxide and indium gallium zinc oxide may be small (e.g., about 0.38 eV or some other suitable value). In other embodiments, the ferroelectric layers 106, the semiconductor channel layer 206, the channel-bottom blocking layer 302, or any combination of the foregoing is/are some other suitable materials.

Figure 3B:
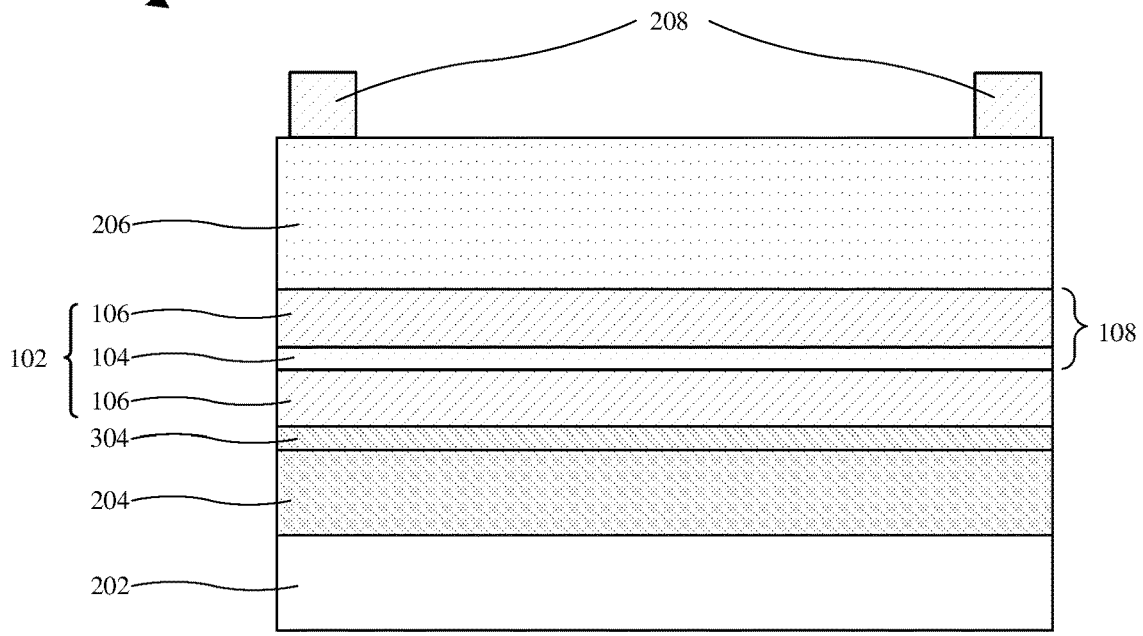

In FIG. 3B, a bottom buffer layer 304 is disposed vertically between the bottom electrode 204 and the stacked ferroelectric structure 102. The bottom buffer layer 304 may, for example, be configured to reduce stress between the bottom electrode 204 and the stacked ferroelectric structure 102 to prevent delamination and/or other failure. The stress may, for example, be caused by different coefficients of thermal expansion between the bottom electrode 204 and the stacked ferroelectric structure 102.

In some embodiments, the bottom buffer layer 304 has a thickness of about 0.5-5.0 nanometers or some other suitable value. In some embodiments, the bottom buffer layer 304 is or comprises aluminum oxide (e.g., $Al_2O_3$), tantalum oxide (e.g., $Ta_2O_5$), potassium oxide (e.g., $K_2O$), rubidium oxide (e.g., $Rb_2O$), strontium oxide (e.g., SrO), barium oxide (e.g., BaO), amorphous vanadium oxide (e.g., a-$V_2O_3$), amorphous chromium oxide (e.g., a-$Cr_2O_3$), amorphous gallium oxide (e.g., a-$Ga_2O_3$), amorphous iron oxide (e.g., a-$Fe_2O_3$), amorphous titanium oxide (e.g., a-$Ti_2O_3$), amorphous indium oxide (e.g., a-$In_2O_3$), yttrium aluminum oxide (e.g., $YAlO_3$), bismuth oxide (e.g., $Bi_2O_3$), ytterbium oxide (e.g., $Yb_2O_3$), dysprosium oxide (e.g., $Dy_2O_3$), gadolinium oxide (e.g., $Gd_2O_3$), strontium titanium oxide (e.g., $SrTiO_3$), dysprosium scandium oxide (e.g., $DyScO_3$), terbium scandium oxide (e.g., $TbScO_3$), gadolinium scandium oxide (e.g., $GdScO_3$), neodymium scandium oxide (e.g., $NdScO_3$), neodymium gallium oxide (e.g., $NdGaO_3$), lanthanum strontium aluminum tantalum oxide (e.g., $LaSrAlTaO_3$ or LSAT), some other suitable material(s), or any combination of the foregoing. In some embodiments, the bottom buffer layer 304 is bilayer epitaxial electrode comprising a first layer and a second layer. The first layer may, for example, be or comprise lanthanum strontium manganese oxide (e.g., $LaSrMnO_3$ or LSMO) or some other suitable material, and/or the second layer may, for example, be or comprise strontium titanium oxide (e.g., $SrTiO_3$), dysprosium scandium oxide (e.g., $DyScO_3$), terbium scandium oxide (e.g., $TbScO_3$), gadolinium scandium oxide (e.g., $GdScO_3$), neodymium scandium oxide (e.g., $NdScO_3$), neodymium gallium oxide (e.g., $NdGaO_3$), lanthanum strontium aluminum tantalum oxide (e.g., $LaSrAlTaO_3$), some other suitable material(s), or any combination of the foregoing.

Figure 3C:
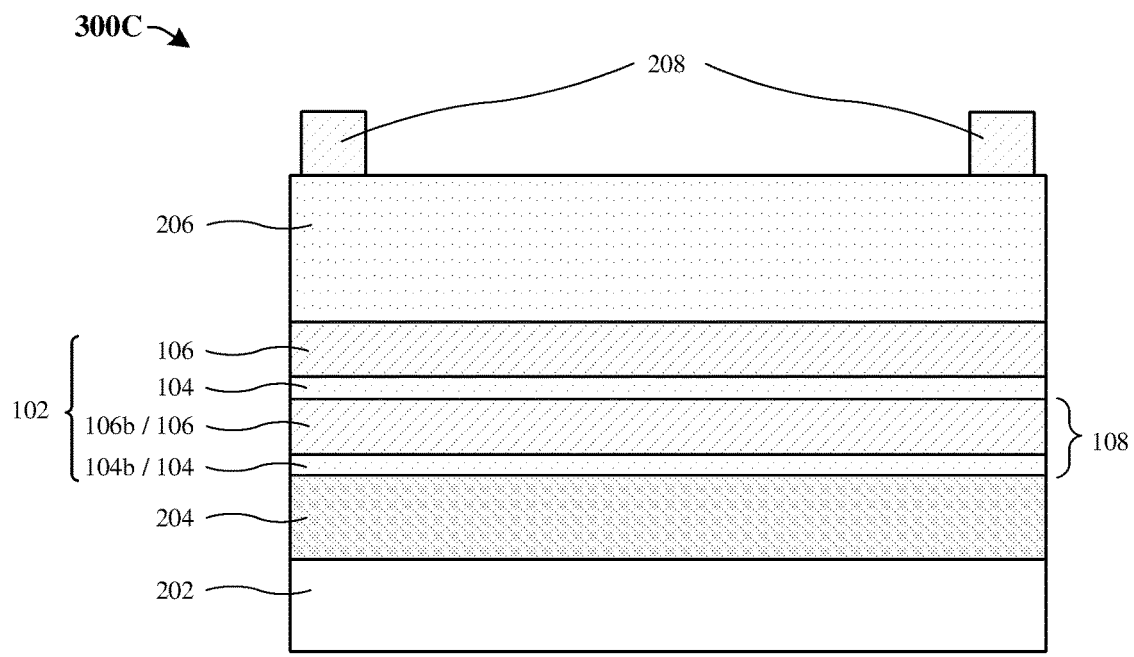

In FIG. 3C, the stacked ferroelectric structure 102 comprises a bottom restoration layer 104b at a bottom of the stacked ferroelectric structure 102. The bottom restoration layer 104b is a restoration layer 104 and hence may, for example, be as the restoration layers 104 are described with regard to FIG. 1, except as noted below.

The bottom restoration layer 104b separates a remainder of the stacked ferroelectric structure 102 from the bottom electrode 204 and serves as a seed layer for a bottom ferroelectric layer 106b immediately overlying the bottom restoration layer 104b. The bottom restoration layer 104b has a crystalline lattice dominated by the orthorhombic phase. Because the crystalline lattice of the bottom restoration layer 104b is dominated by the orthorhombic phase, the crystalline lattice of the bottom ferroelectric layer 106b epitaxially grows from the bottom restoration layer 104b with the orthorhombic phase dominating. This, in turn, may inhibit the monoclinic phase. By promoting the orthorhombic phase and/or inhibiting the monoclinic phase, the bottom restoration layer 104b increases the remanent polarization of the bottom ferroelectric layer 106b and hence the remanent polarization of the stacked ferroelectric structure 102.

In some embodiments, the bottom restoration layer 104b is crystalline zirconium oxide ($ZrO_2$), whereas the bottom ferroelectric layer 106b is or comprises hafnium zirconium oxide (e.g., HfZrO). Other suitable materials are, however, amenable in alternative embodiments. In some embodiments, the bottom restoration layer 104b is crystalline (e.g., single crystalline or quasi-single crystalline), whereas a remainder of the restoration layers 104 is/are amorphous and/or heterogeneous. In some embodiments, the bottom restoration layer 104b and the remainder of the restoration layers 104 are crystalline.

Figure 3D:
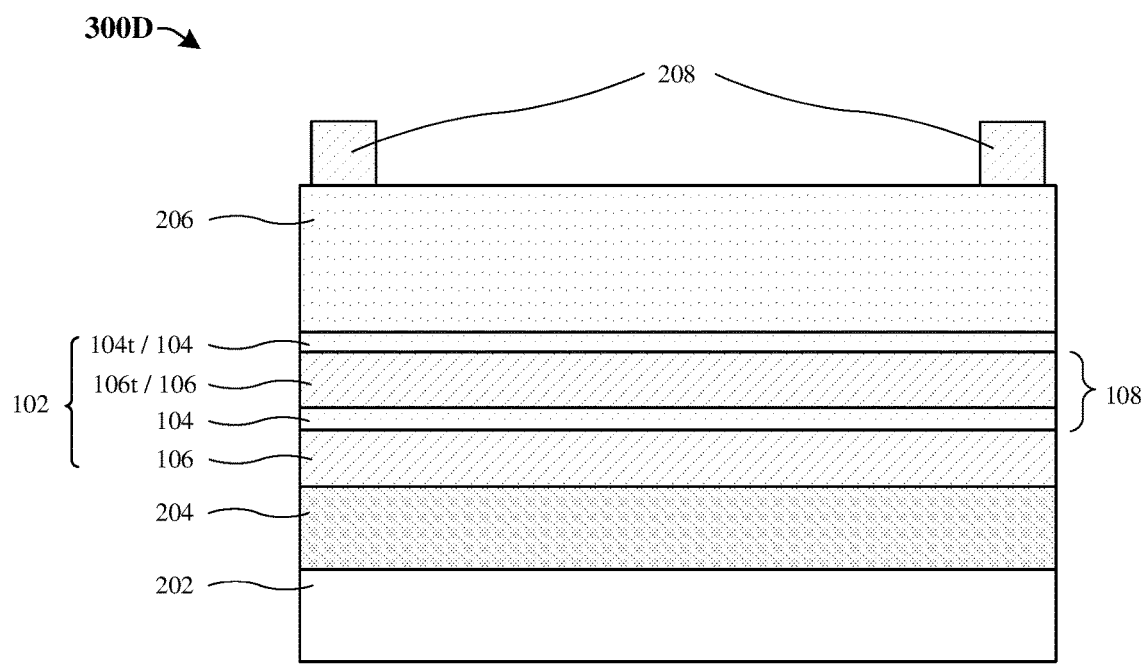

In FIG. 3D, the stacked ferroelectric structure 102 comprises a top restoration layer 104t at a top of the stacked ferroelectric structure 102. The top restoration layer 104t is a restoration layer 104 and hence may, for example, be as the restoration layers 104 are described with regard to FIG. 1, except as noted below.

The top restoration layer 104t separates a remainder of the stacked ferroelectric structure 102 from the semiconductor channel layer 206 and, in some embodiments, enhances a remanent polarization of the stacked ferroelectric structure 102. For example, the top restoration layer 104t may have a crystalline lattice that stabilizes a crystalline lattice of a top ferroelectric layer 106t immediately underlying the top restoration layer 104t. This may prevent thermodynamic instability in the orthorhombic phase of the top ferroelectric layer 106t during thermal processing performed after forming the stacked ferroelectric structure 102 and may therefore preserve the orthorhombic phase. Hence, the top restoration layer 104t may indirectly enhance remanent polarization of the stacked ferroelectric structure 102.

In some embodiments, the top restoration layer 104t is crystalline. In alternative embodiments, the top restoration layer 104t is amorphous. In some embodiments, the top restoration layer 104t is crystalline zirconium oxide ($ZrO_2$), whereas the top ferroelectric layer 106t is or comprises hafnium zirconium oxide (e.g., HfZrO). Other suitable materials are, however, amenable in alternative embodiments.

Figure 3E:
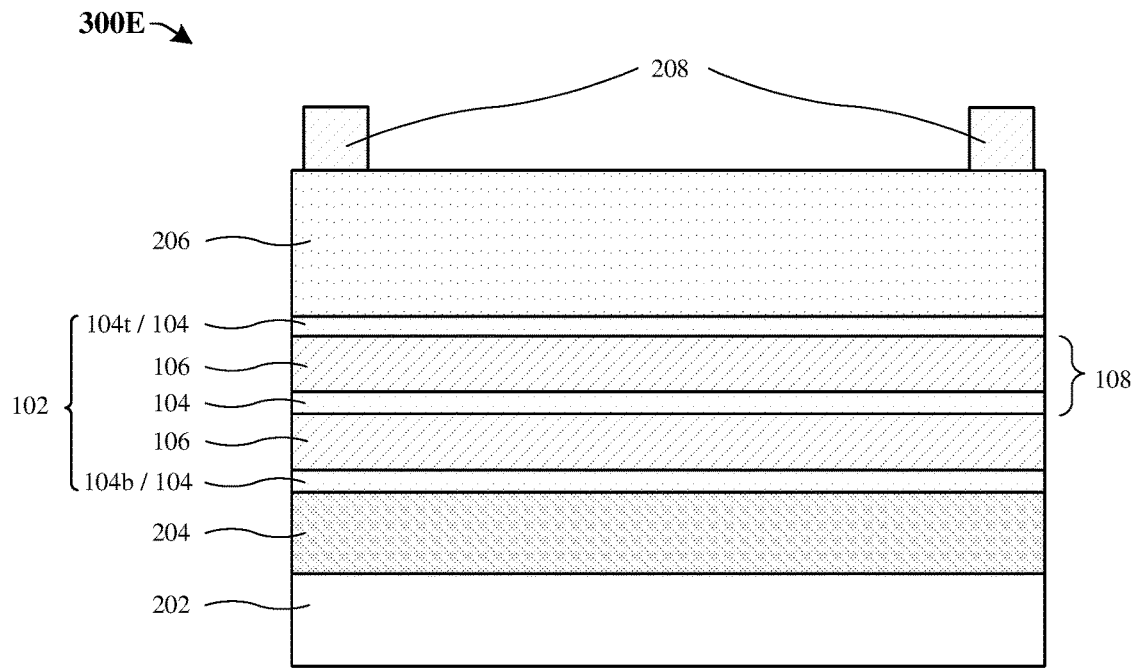

In FIG. 3E, the bottom gate FeFET structure comprises the bottom restoration layer 104b of FIG. 3C and the top restoration layer 104t of FIG. 3D to enhance a remanent polarization of the stacked ferroelectric structure 102.

Figure 3F:
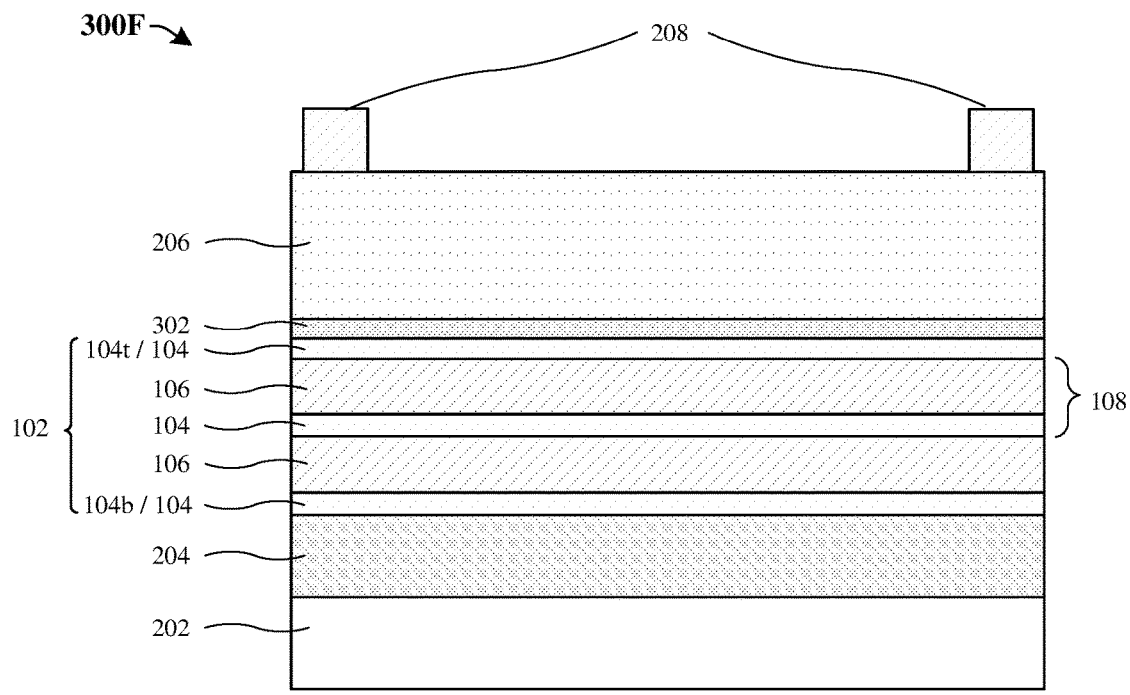

In FIG. 3F, the bottom gate FeFET structure comprises the channel-bottom blocking layer 302 of FIG. 3A. Further, the bottom gate FeFET structure comprises both the bottom restoration layer 104b of FIG. 3C and the top restoration layer 104t of FIG. 3D to enhance a remanent polarization of the stacked ferroelectric structure 102.

In some embodiments, an interfacial layer (not shown) develops between the top restoration layer 104t and the channel-bottom blocking layer 302. The interfacial layer may, for example, consume or otherwise extend into the top restoration layer 104t by about 0-1 nanometers or some other suitable amount and/or may, for example, consume or otherwise extend into the channel-bottom blocking layer 302 by about 0-1 nanometers or some other suitable amount. In some embodiments, the channel-bottom blocking layer 302 is or comprises silicon doped hafnium oxide (e.g., Si:$HfO_2$) and the top restoration layer 104t is or comprises zirconium oxide (e.g., $ZrO_2$), such that the interfacial layer is or comprises zirconium hafnium oxide. In some of such embodiments, a portion of the channel-bottom blocking layer 302 corresponding to the interfacial layer may have a ratio of oxygen to hafnium greater than about 1 or some other suitable amount and/or a portion of the top restoration layer 104t corresponding to the interfacial layer may have a ratio of oxygen to zirconium greater than or equal to about 1 or some other suitable amount.

Figure 3G:
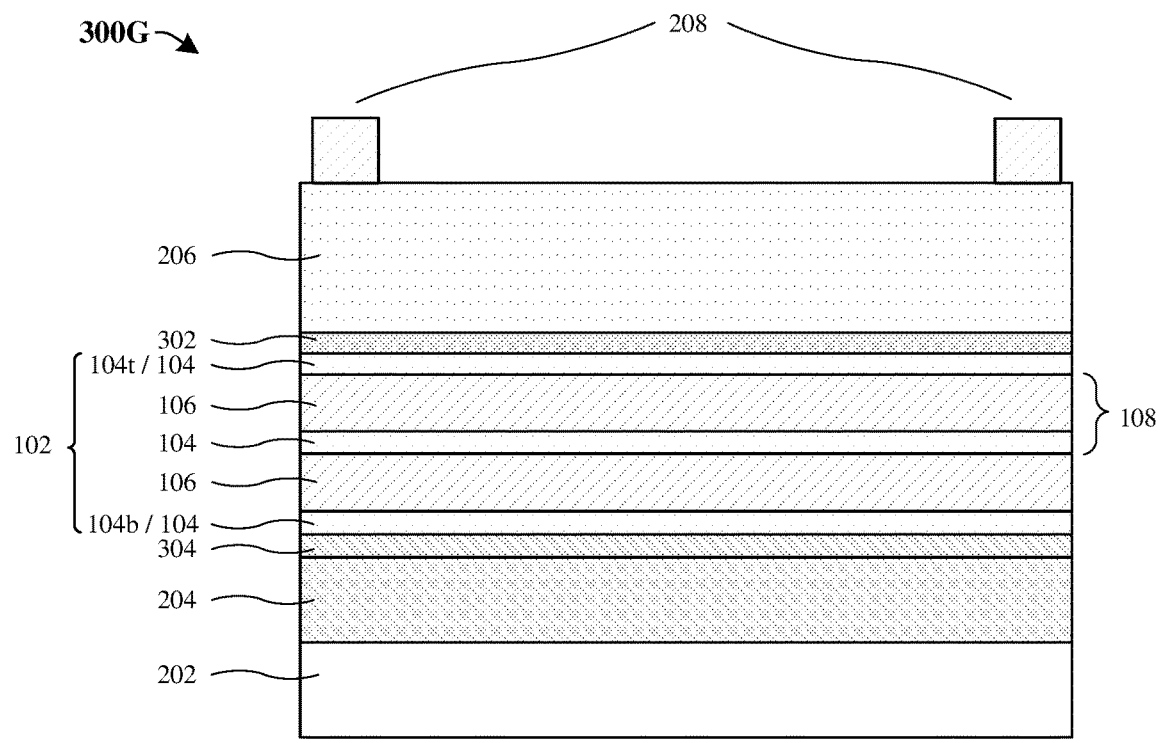

In FIG. 3G, the bottom gate FeFET structure comprises the channel-bottom blocking layer 302 of FIG. 3A and the bottom buffer layer 304 of FIG. 3B. Further, the bottom gate FeFET structure comprises both the bottom restoration layer 104b of FIG. 3C and the top restoration layer 104t of FIG. 3D to enhance a remanent polarization of the stacked ferroelectric structure 102.

Figure 4:
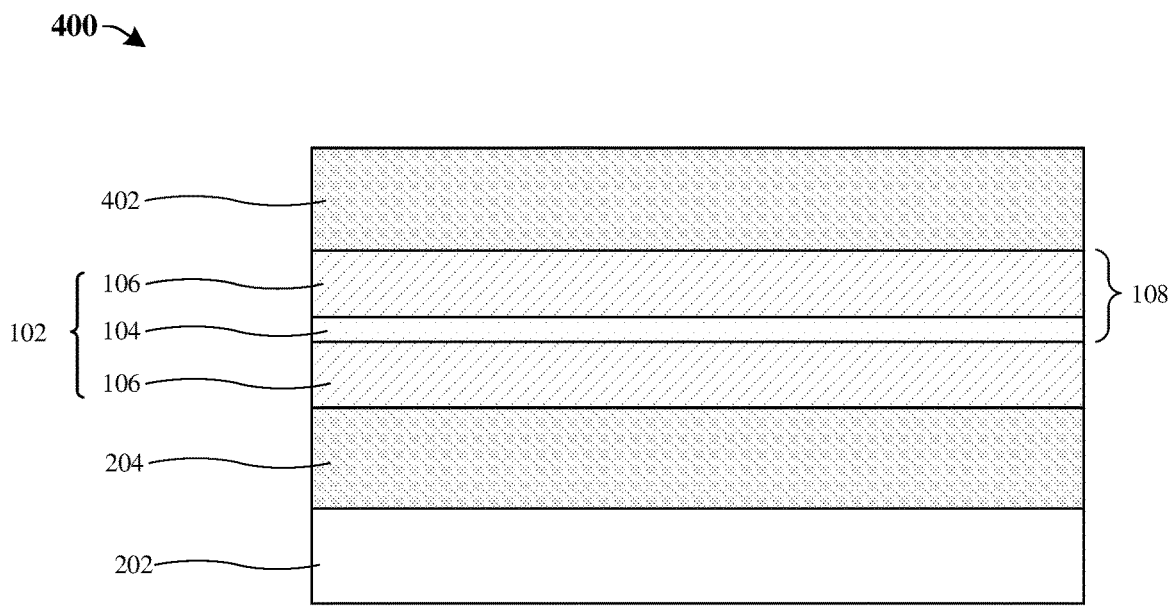
FIG. 4 illustrates a cross-sectional view of some embodiments of an IC in which a metal-ferroelectric-metal (MFM) structure comprises a stacked ferroelectric structure.

With reference to FIG. 4, a cross-sectional view 400 of some embodiments of an IC in which a MFM structure comprises a stacked ferroelectric structure 102 is provided. The stacked ferroelectric structure 102 is as described with regard to FIG. 1, except that it has a pair of ferroelectric layers 106 and a single restoration layer 104 between the ferroelectric layers 106. In alternative embodiments, the stacked ferroelectric structure 102 has one or more additional ferroelectric-layer-restoration-layer pairs 108.

The MFM structure overlies a substrate 202 and further comprises a bottom electrode 204 and a top electrode 402. The stacked ferroelectric structure 102 overlies the bottom electrode 204, and the top electrode 402 overlies the stacked ferroelectric structure 102. Further, the MFM structure defines a capacitor that may, for example, be employed for data storage. In some embodiments, the MFM structure defines the capacitor in a one-transistor one-capacitor (1T1C) memory structure or some other suitable type of memory structure.

In some embodiments, the substrate 202 and the bottom electrode 204 are as described with regard to FIG. 2. In some embodiments, the top electrode 402 is as the bottom electrode 204 is described with regard to FIG. 2. For example, the top electrode 402 may be or comprise titanium nitride (e.g., TiN) and/or some other suitable material(s).

Figure 5A:
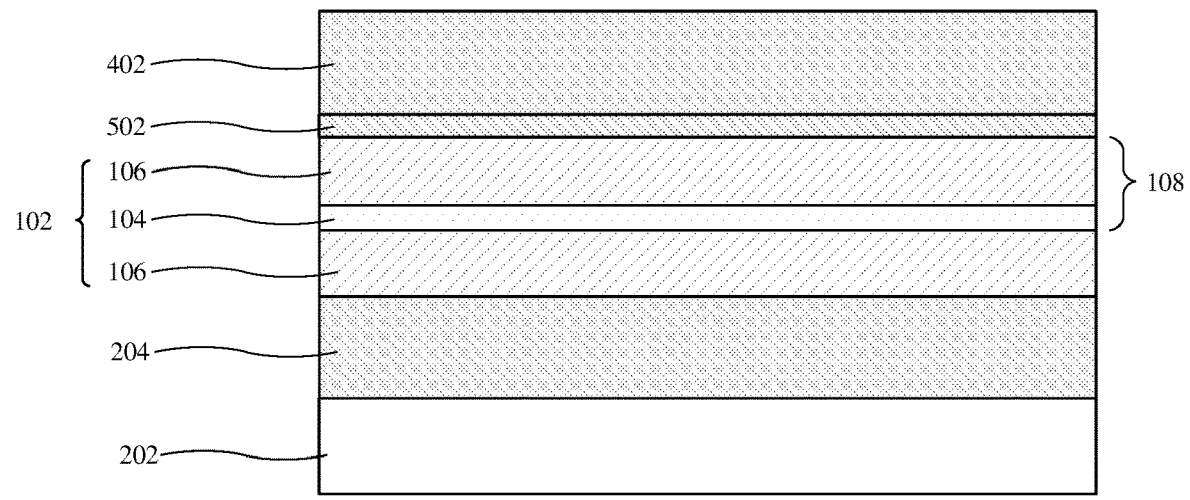
FIGS. 5A-5C illustrate some alternative embodiments of the IC of FIG. 4 in which the MFM structure is varied.
Figure 5B:
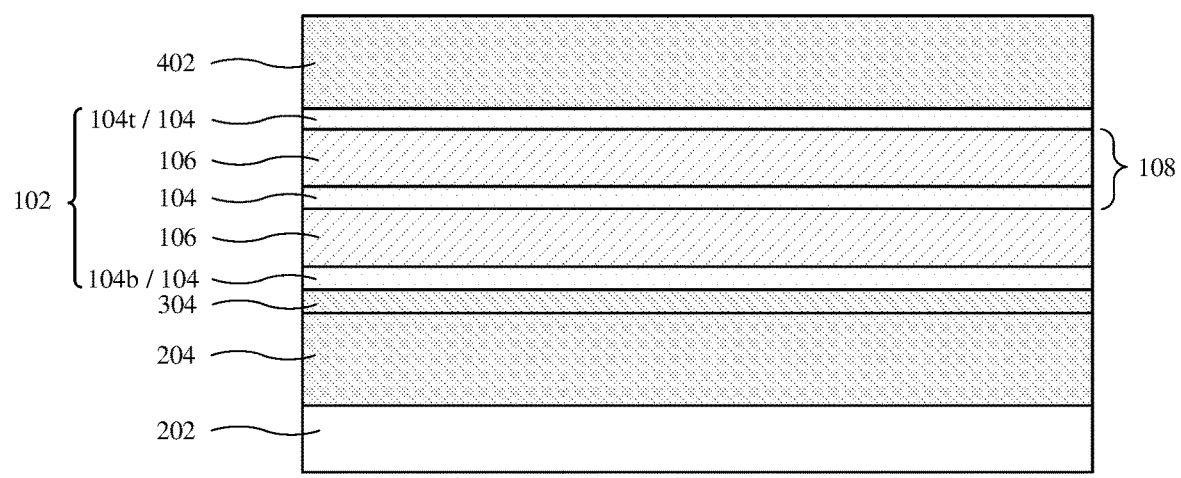
Figure 5C:
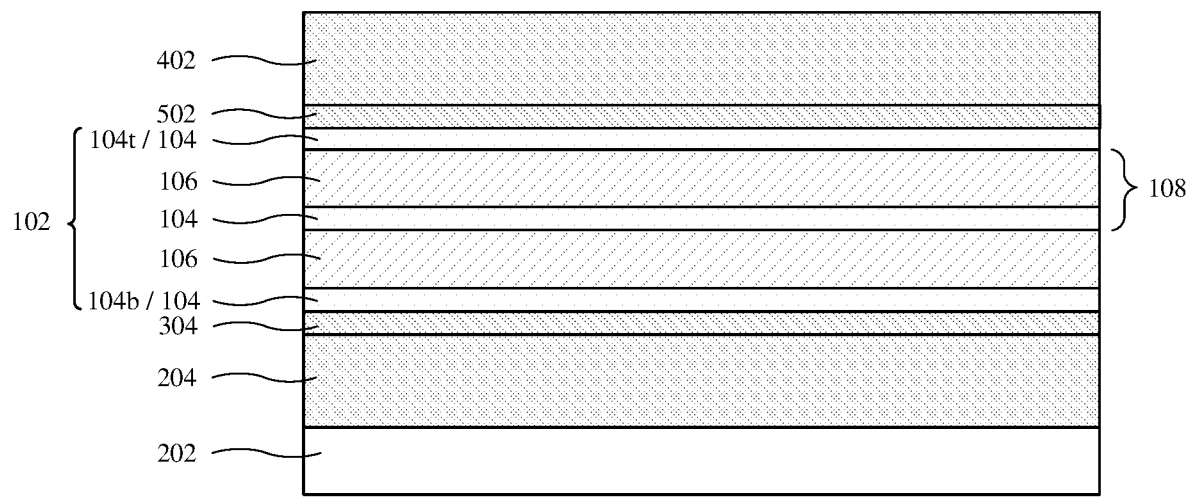

With reference to FIGS. 5A-5C, cross-sectional views 500A-500C of some alternative embodiments of the IC of FIG. 4 are provided in which the MFM structure is varied.

In FIG. 5A, a top buffer layer 502 is disposed vertically between the top electrode 402 and the stacked ferroelectric structure 102. The top buffer layer 502 may, for example, be configured to reduce stress between the top electrode 402 and the stacked ferroelectric structure 102 to prevent delamination and/or other failure. The stress may, for example, be caused by different coefficients of thermal expansion between the top electrode 402 and the stacked ferroelectric structure 102. The top buffer layer 502 may, for example, be as the bottom buffer layer 304 is described with regard to FIG. 3B.

In FIG. 5B, the MFM structure comprises the bottom buffer layer 304 of FIG. 3B, the bottom restoration layer 104b of FIG. 3C, and the top restoration layer 104t of FIG. 3D. The bottom and top restoration layers 104b, 104t enhance the remanent polarization of the stacked ferroelectric structure 102. The bottom buffer layer 304 reduces stress between the bottom electrode 204 and the stacked ferroelectric structure 102.

In FIG. 5C, the MFM structure is as in FIG. 5B except that it further includes the top buffer layer 502 of FIG. 5A for enhanced stress relief.

In alternative embodiments of FIGS. 5B and 5C, the top restoration layer 104t, the bottom restoration layer 104b, the bottom buffer layer 304, or any combination of the foregoing may be omitted.

Figure 6:
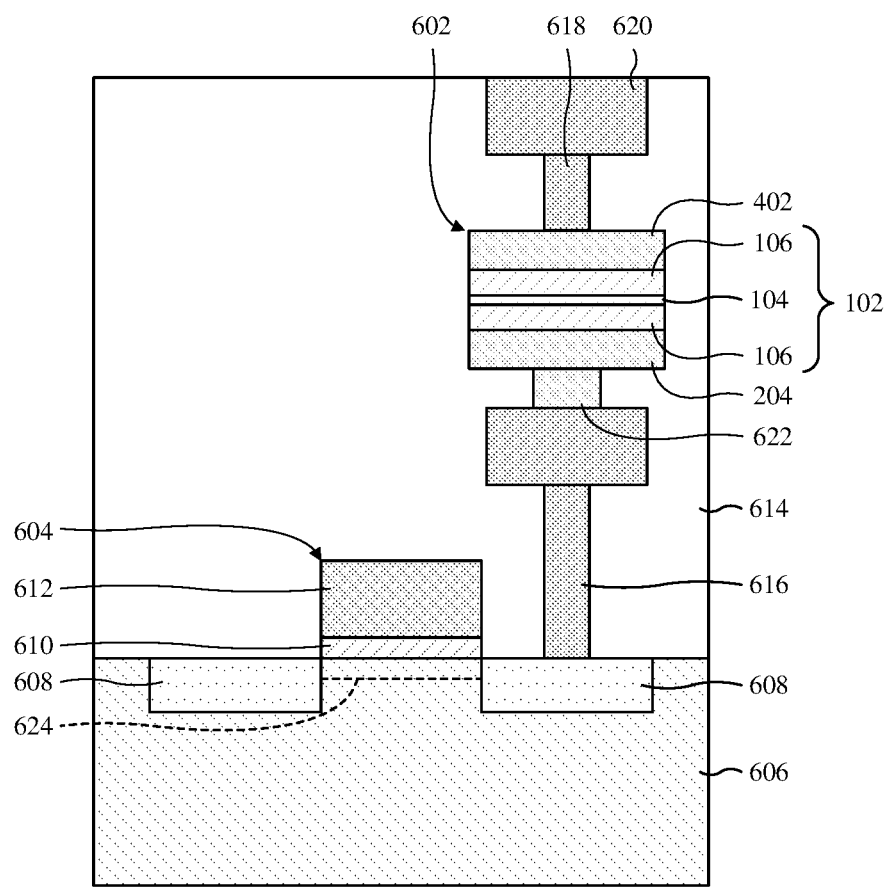
FIG. 6 illustrates a cross-sectional view of some embodiments of an IC in which a one-transistor one-capacitor (1T1C) memory structure comprises the MFM structure of FIG. 4.

With reference to FIG. 6, a cross-sectional view 600 of some embodiments of an IC is provided in which a 1T1C memory structure comprises an MFM structure 602 as in FIG. 4. The MFM structure 602 overlies and is electrically coupled to an access device 604.

The access device 604 is on and partially defined by a semiconductor substrate 606. Further, the access device 604 comprises a pair of source/drain regions 608, a gate dielectric layer 610, and a gate electrode 612. The source/drain regions 608 are embedded in a top of the semiconductor substrate 606, and the gate dielectric layer 610 and the gate electrode 612 are stacked between the source/drain regions 608. In some embodiments, the access device 604 is a planar field-effect transistor (FET). In other embodiments, the access device 604 is a fin FET (FinFET), a gate-all-around (GAA) FET, or some other suitable type of semiconductor device.

An interconnect structure overlies the semiconductor substrate 606 and electrically couples to the MFM structure 602 and the access device 604. The interconnect structure comprises a contact via 616, an interlevel via 618, and a plurality of wires 620 in an interconnect dielectric layer 614. The contact via 616 extends from a bottom one of the wires 620 to one of the source/drain regions 608. Further, a bottom electrode via (BEVA) 622 of the MFM structure 602 is at a bottom of the MFM structure 602 and extends from the bottom electrode 204 to the bottom one of the wires 620. In some embodiments, the BEVA 622 is integrated with the bottom electrode 204. In alternative embodiments, the BEVA 622 is independent of the bottom electrode 204. The interlevel via 618 overlies the MFM structure 602 and extends from a top one of the wires 620 to the MFM structure 602.

During operation of the 1T1C structure, a bit of data is stored in the MFM structure 602 using the remanent polarization of the stacked ferroelectric structure 102 to represent the bit. To write, the gate electrode 612 is biased so a channel region 624 underlying the gate electrode 612 conducts and electrically connects the source/drain regions 608. A set voltage or a reset voltage is then applied across the MFM structure 602 through the channel region 624 of the access device 604 to set the remanent respectively to a first state or a second state. To read, the gate electrode 612 is again biased so the channel region 624 electrically connects the source/drain regions 608. The set or reset voltage is then applied across the MFM structure 602 through the channel region 624 of the access device 604. If the state of the remanent polarization changes, a current pulse occurs. Otherwise, no current pulse occurs. Hence, the current pulse is used to identify the state of the remanent polarization.

In some embodiments, the semiconductor substrate 606 is a bulk substrate of silicon, an SOI substrate, or some other suitable semiconductor substrate. In some embodiments, the source/drain regions 608 are doped regions of the semiconductor substrate 606. In other embodiments, the source/drain regions 608 are independent of the semiconductor substrate 606 and are inset into a top of the semiconductor substrate 606. In some embodiments, the gate electrode 612 is or comprises doped polysilicon, metal, some other suitable conductive material, or any combination of the foregoing. In some embodiments, the gate dielectric layer 610 is or comprises silicon oxide and/or some other suitable dielectric. In some embodiments, the wires 620, the interlevel via 618, the contact via 616, and the BEVA 622 are or comprise metal and/or some other suitable conductive material. In some embodiments, the interconnect dielectric layer 614 is or comprise a dielectric oxide and/or some other suitable dielectric.

While the MFM structure 602 is illustrated as in FIG. 4, the MFM structure 602 may be as in any of FIGS. 5A-5C. While the MFM structure 602 is described as part of a 1T1C memory structure, the MFM structure 602 may alternatively be part of a two-transistor two-capacitor (2T2C) memory structure in alternative embodiments.

Figure 7:
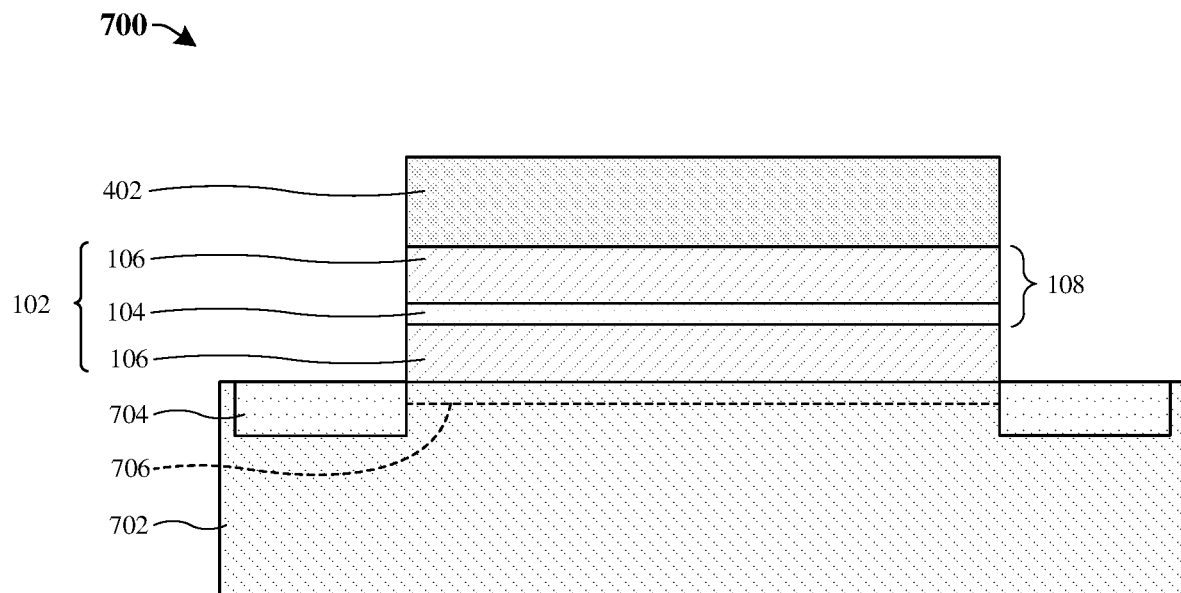
FIG. 7 illustrates a cross-sectional view of some embodiments of an IC in which a top gate FeFET structure comprises a stacked ferroelectric structure.

With reference to FIG. 7, a cross-sectional view 700 of some embodiments of an IC in which a top gate FeFET structure comprises a stacked ferroelectric structure 102 is provided. The stacked ferroelectric structure 102 is as described with regard to FIG. 1, except that it has a pair of ferroelectric layers 106 and a single restoration layer 104 between the ferroelectric layers 106. In alternative embodiments, the stacked ferroelectric structure 102 has one or more additional ferroelectric-layer-restoration-layer pairs 108.

A semiconductor substrate 702 underlies the stacked ferroelectric structure 102, and a top electrode 402 overlies the stacked ferroelectric structure 102. A pair of source/drain regions 704 are embedded in a top of the semiconductor substrate 702, respectively on opposite sides of the stacked ferroelectric structure 102. Further, a channel region 706 extends between the source/drain regions 704, along the top of the semiconductor substrate 702, and selectively conducts depending on a voltage from the top electrode 402 to a source one of the source/drain regions 704. For example, the channel region 706 may conduct when the voltage is more than a threshold voltage and may not conduct when the voltage is less than the threshold voltage, or vice versa. In some embodiments, the source/drain regions 704 are doped regions of the semiconductor substrate 606. In other embodiments, the source/drain regions 608 are independent of and are inset into a top of the semiconductor substrate 606.

The top gate FeFET structure operates similar to the bottom gate FeFET of FIG. 2. The remanent polarization of the stacked ferroelectric structure 102 is employed to represent a bit of data. To write, a set voltage or a reset voltage is applied from the top electrode 402 to the channel region 706 (e.g., via the source/drain regions 704). The set voltage sets the remanent polarization of the stacked ferroelectric structure 102 to the first state, whereas the reset voltage sets the remanent polarization to second state. The threshold voltage varies with the state of the remanent polarization. Therefore, to read, a read voltage less than the coercive voltage and between the different threshold voltage states is applied from the top electrode 402 to the source one of the source/drain regions 704. Depending on whether the channel region 706 conducts, the remanent polarization is in the first or second state.

In some embodiments, the semiconductor substrate 702 is or comprises amorphous Indium-Gallium-Zinc-Oxide (a-IGZO), silicon, silicon germanium, a group III-V material, a group II-VI material, some other suitable semiconductor material, or any combination of the foregoing. The group III-V material may, for example, be or comprise gallium arsenide (e.g., GaAs), gallium arsenide indium (e.g., GaAsIn), or some other suitable group III-V material. The group II-VI material may, for example, be or comprise zinc oxide (e.g., ZnO), magnesium oxide (e.g., MgO), gadolinium oxide (e.g., GdO), or some other suitable II-VI material. In some embodiments, the top electrode 402 has a smaller coefficient of thermal expansion than an immediately underlying layer (e.g., a top one of the ferroelectric layers 106), such that the top electrode 402 applies tensile stress on the immediately underlying layer.

With reference to FIGS. 8A-8D, cross-sectional views 800A-800D of some alternative embodiments of the IC of FIG. 7 are provided in which the top gate FeFET structure is varied.

Figure 8A:
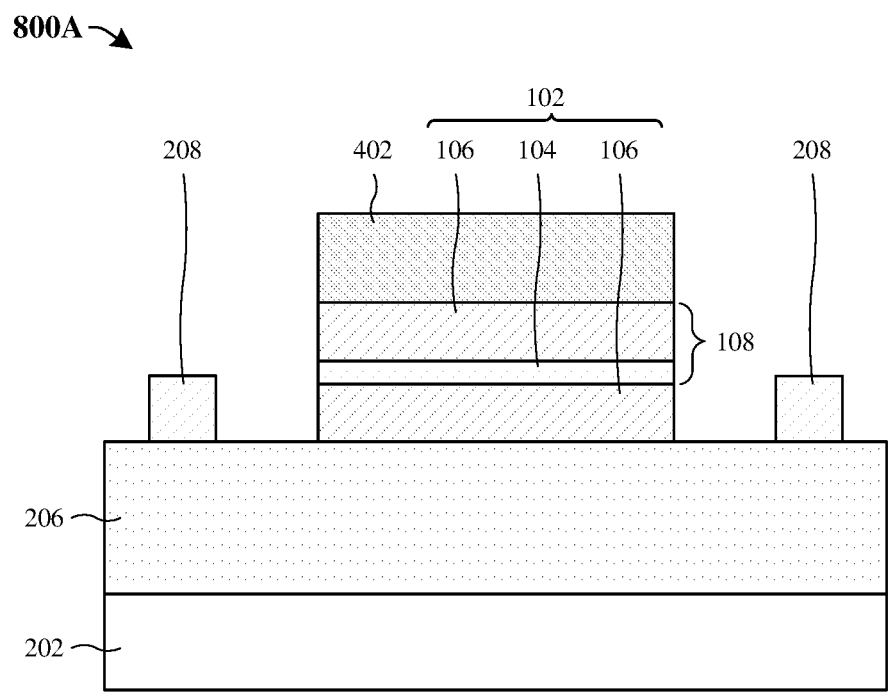
FIGS. 8A-8D illustrate cross-sectional views of some alternative embodiments of the IC of FIG. 7 in which the top gate FeFET structure is varied.

In FIG. 8A, the semiconductor substrate 702, the pair of source/drain regions 704, and the channel region 706 are replaced with a substrate 202, a pair of source/drain contacts 208, and a semiconductor channel layer 206. The semiconductor channel layer 206 overlies the substrate 202, and the pair of source/drain contacts 208 overlie the semiconductor channel layer 206. Operation of the top gate FeFET structure is as described with regard to FIG. 7, except that the source/drain contacts 208 are used in place of the source/drain regions 704 and the semiconductor channel layer 206 is used in place of the channel region 706. In some embodiments, the semiconductor channel layer 206, the substrate 202, and the source/drain contacts 208 are as described with regard to FIG. 2.

Figure 8B:
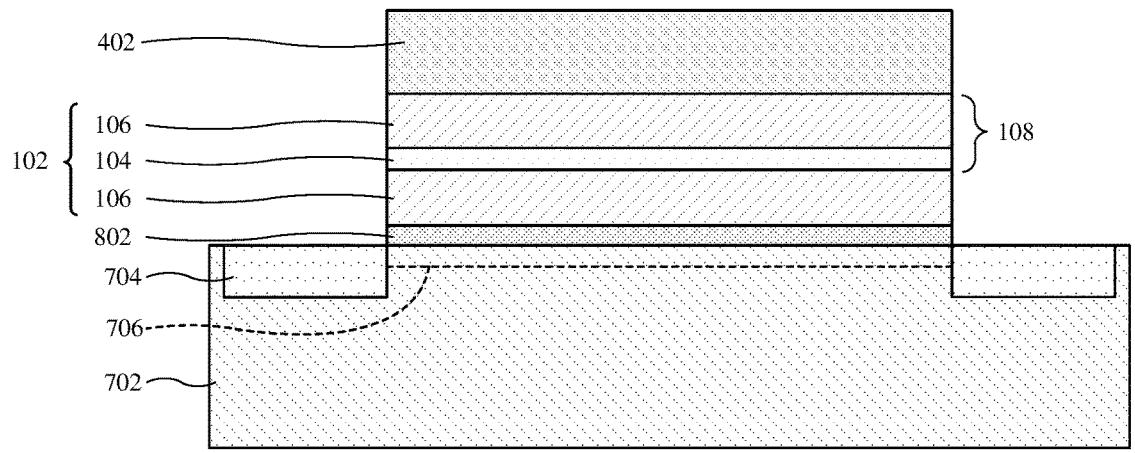

In FIG. 8B, the top gate FeFET structure further comprises a channel-top blocking layer 802 disposed vertically between the semiconductor channel layer 206 and the stacked ferroelectric structure 102. The channel-top blocking layer 802 is as the channel-bottom blocking layer 302 of FIG. 3A is described and hence inhibits oxygen vacancies and/or leakage current at the semiconductor channel layer 206 to enhance performance.

Figure 8C:
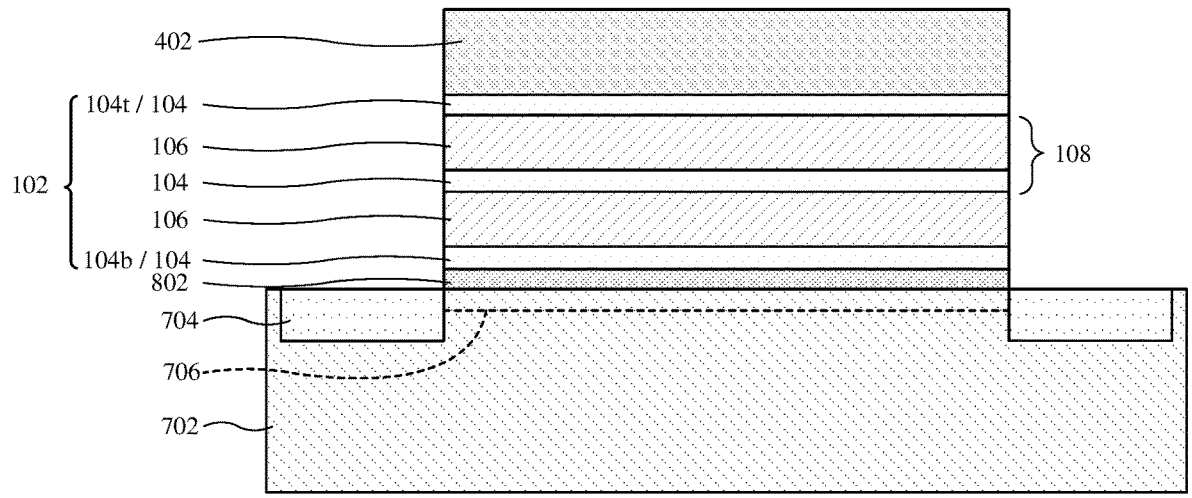

In FIG. 8C, the top gate FeFET structure comprises the bottom restoration layer 104b of FIG. 3C, the top restoration layer 104t of FIG. 3D, and the channel-top blocking layer 802 of FIG. 8B. The bottom and top restoration layers 104b, 104t are respectively at a bottom of the stacked ferroelectric structure 102 and a top of the stacked ferroelectric structure 102 to enhance the remanent polarization of the stacked ferroelectric structure 102.

Figure 8D:
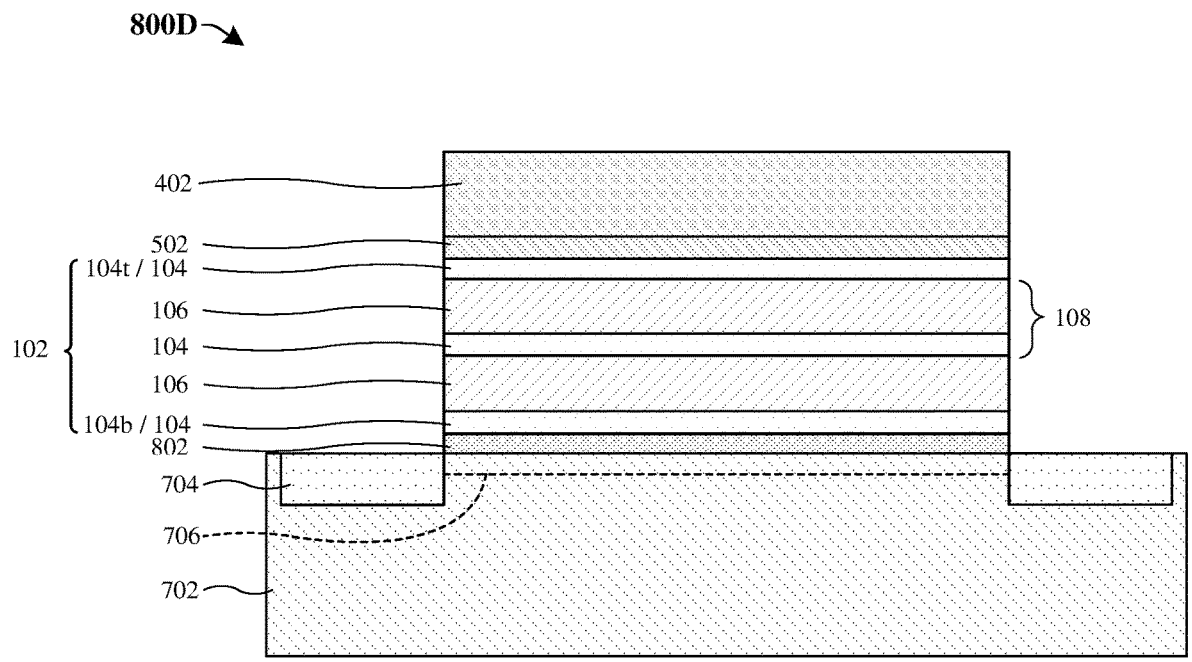

In FIG. 8D, the top gate FeFET structure is as in FIG. 8C, except that it further includes the top buffer layer 502 of FIG. 5A. The top buffer layer 502 is between the top electrode 402 and the stacked ferroelectric structure 102 and may, for example, be configured to reduce stress between the top electrode 402 and the stacked ferroelectric structure 102 to prevent delamination and/or other failure.

In alternative embodiments of FIGS. 8C and 8D, the bottom restoration layer 104b, the top restoration layer 104t, the channel-top blocking layer 802, or any combination of the foregoing may be omitted. In alternative embodiments of FIGS. 8B-8D, the semiconductor substrate 702, the pair of source/drain regions 704, and the channel region 706 may be replaced with the substrate 202, the pair of source/drain contacts 208, and the semiconductor channel layer 206 as in FIG. 8A.

Figure 9:
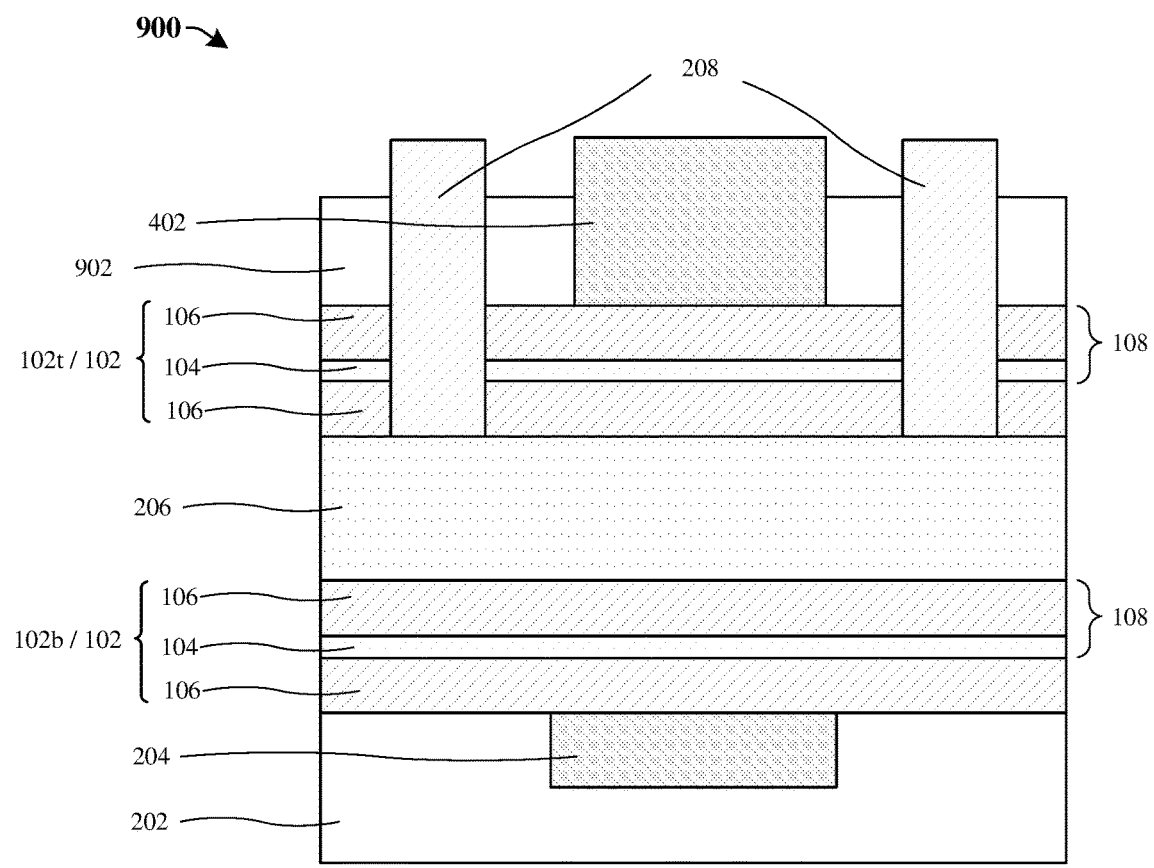
FIG. 9 illustrates a cross-sectional view of some embodiments of an IC in which a double gate FeFET structure comprises a stacked ferroelectric structure.

With reference to FIG. 9, a cross-sectional view 900 of some embodiments of an IC in which a double gate FeFET structure comprises a pair of stacked ferroelectric structures 102 is provided. For example, the double gate FeFET structure comprises a bottom stacked ferroelectric structure 102b and a top stacked ferroelectric structures 102t. The stacked ferroelectric structures 102 are each as described with regard to FIG. 1, except that the stacked ferroelectric structures 102 each have a pair of ferroelectric layers 106 and a single restoration layer 104 between the ferroelectric layers 106. In alternative embodiments, one or both of the stacked ferroelectric structures 102 each has one or more additional ferroelectric-layer-restoration-layer pairs 108. Further, the stacked ferroelectric structures 102 respectively overlie and underlie a semiconductor channel layer 206.

A substrate 202 and a bottom electrode 204 underlie the stacked ferroelectric structures 102, and the bottom electrode 204 is inset into a top of the substrate 202. In alternative embodiments, the bottom electrode 204 is not inset into the top of the substrate 202 and has a bottom surface overlying a top surface of the substrate 202. Further, a top electrode 402 and a passivation layer 902 overlie the stacked ferroelectric structures 102, and the top electrode 402 extends through the passivation layer 902 to the top stacked ferroelectric structure 102t. In some embodiments, the passivation layer 902 is or comprise silicon oxide, silicon nitride, some other suitable dielectrics, or any combination of the foregoing. A pair of source/drain contacts 208 are respectively on opposite sides of the top electrode 402 and extend through the passivation layer 902 and the top stacked ferroelectric structure 102t to the semiconductor channel layer 206.

The dual gate FeFET structure operates similar to the bottom gate FeFET of FIG. 2 and the top gate FeFET of FIG. 7. Remanent polarizations of the stacked ferroelectric structures 102 are employed to represent a bit of data. Further, the stacked ferroelectric structures 102 are controlled so the remanent polarizations maintain the same polarity (e.g., same states). Note that a polarity of the bottom stacked ferroelectric structure 102b is from the bottom electrode 204 to the semiconductor channel layer 206, whereas a polarity of top stacked ferroelectric structure 102t is from the top electrode 402 to the semiconductor channel layer 206. Because the remanent polarizations maintain the same polarity, the remanent polarizations are additive and the change in threshold voltage between data states is doubled compared to a single gate FeFET structure. This, in turn, increases the size of the read window and hence increases the reliability of read operations.

Figure 10A:
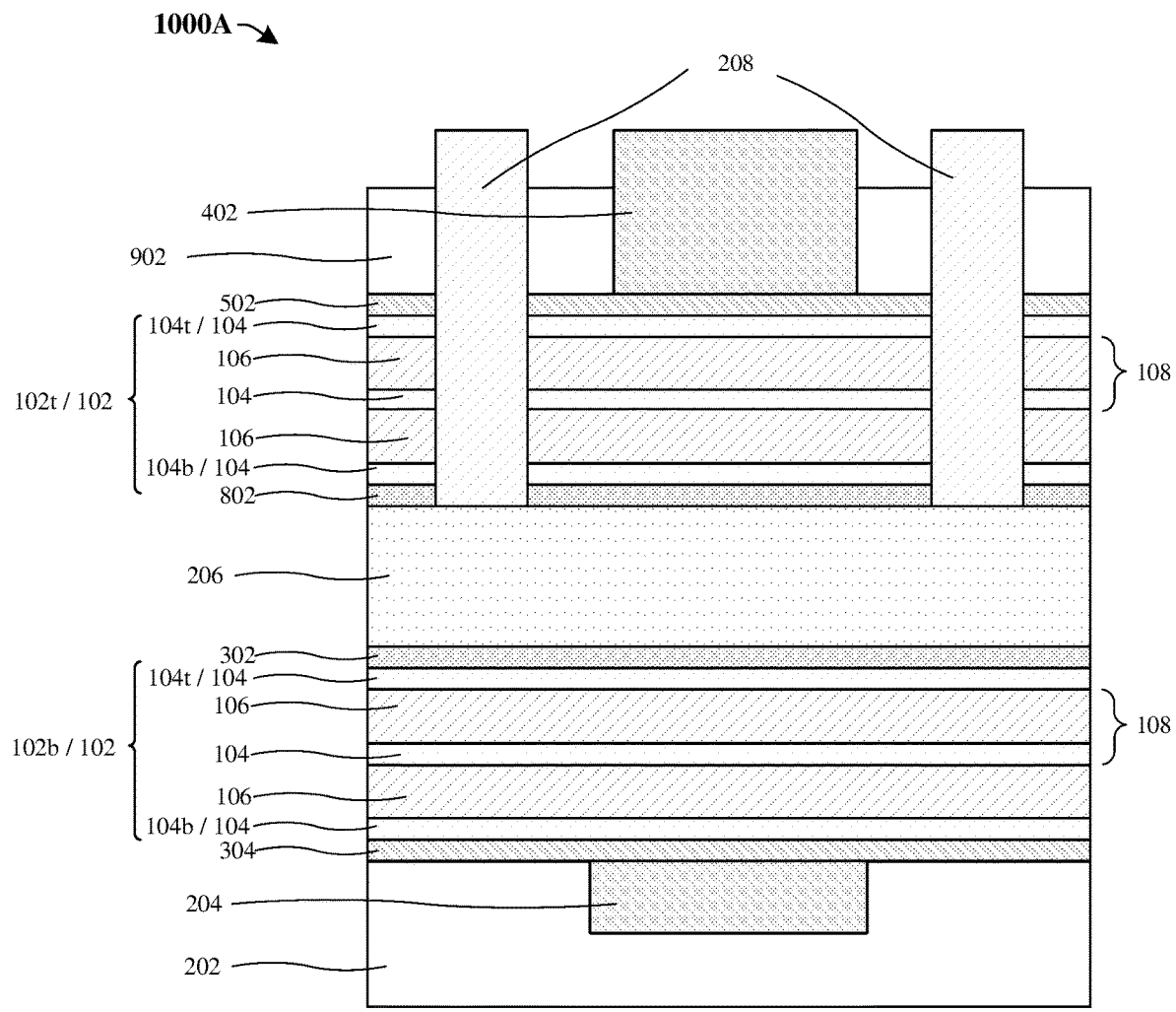
FIGS. 10A and 10B illustrate cross-sectional views of some alternative embodiments of the IC of FIG. 9 in which the double gate FeFET structure is varied.
Figure 10B:
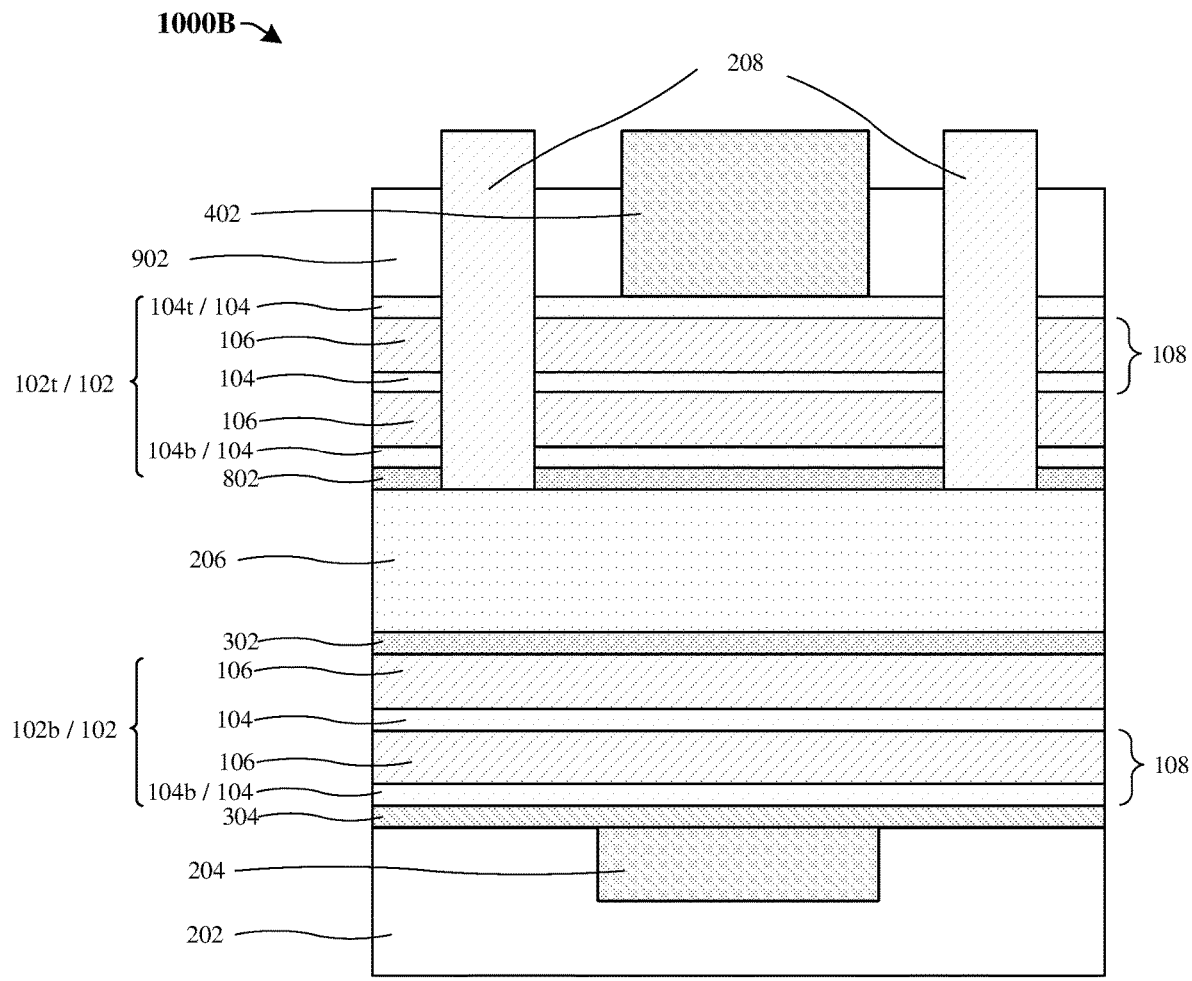

With reference to FIGS. 10A and 10B, cross-sectional views 1000A and 1000B of some alternative embodiments of the IC of FIG. 9 are provided in which the double gate FeFET structure is varied.

In FIG. 10A, the stacked ferroelectric structures 102 each comprise the bottom restoration layer 104b of FIG. 3C and the top restoration layer 104t of FIG. 3D. Further, the channel-bottom blocking layer 302 of FIG. 3A and the channel-top blocking layer 802 separate the semiconductor channel layer 206 respectively from the bottom stacked ferroelectric structure 102b and the top stacked ferroelectric structures 102t. The bottom and top restoration layers 104b, 104t enhance the remanent polarization of the stacked ferroelectric structures 102, whereas the channel-bottom blocking layer 302 and the channel-top blocking layer 802 inhibit oxygen vacancies and/or leakage current to enhance performance.

Additionally, the bottom buffer layer 304 of FIG. 3B and the top buffer layer 502 of FIG. 5A separate the stacked ferroelectric structures 102 respectively from the bottom electrode 204 and the top electrode 402. The bottom and top buffer layers 304, 502 may, for example, be configured to reduce stress respectively at the bottom and top electrodes 204, 402.

In FIG. 10B, the double gate FeFET structure is as in FIG. 10A except that the top buffer layer 502 and the top restoration layer 104t of the bottom stacked ferroelectric structure 102b are omitted.

In alternative embodiments of FIG. 10A, any one or combination of the following is/are omitted: 1) the bottom restoration layer 104b of the bottom stacked ferroelectric structure 102b; 2) the top restoration layer 104t of the bottom stacked ferroelectric structure 102b; 3) the bottom buffer layer 304; 4) the channel-bottom blocking layer 302; 5) the bottom restoration layer 104b of the top stacked ferroelectric structure 102t; 6) the top restoration layer 104t of the top stacked ferroelectric structure 102t; 7) the top buffer layer 502; and 8) the channel-top blocking layer 802. In alternative embodiments of FIGS. 10A and 10B, the bottom stacked ferroelectric structure 102b has different numbers of ferroelectric layers 106 and restoration layers 104 than the top stacked ferroelectric structure 102t.

While FIGS. 2, 3A-3G, 4, 5A-5C, 6, 7, and 8A-8D illustrate the stacked ferroelectric structure 102 with a set number of ferroelectric-layer-restoration-layer pairs 108, the stacked ferroelectric structure 102 may comprise one or more additional ferroelectric-layer-restoration-layer pairs 108 in alternative embodiments to increase remanent polarization. While FIGS. 9, 10A, and 10B illustrate the bottom stacked ferroelectric structure 102b and the top stacked ferroelectric structure 102t with set numbers of ferroelectric-layer-restoration-layer pairs 108, the bottom stacked ferroelectric structure 102b and/or the top stacked ferroelectric structure 102t may each comprise one or more additional ferroelectric-layer-restoration-layer pairs 108 in alternative embodiments to increase remanent polarization.

With reference to FIGS. 11-16, 17A, 17B, 18A, and 18B, a series of cross-sectional views 1100-1800 of some embodiments of a method for forming an IC in which a bottom gate FeFET structure or an MFM structure comprises a stacked ferroelectric structure is provided. Although FIGS. 11-16, 17A, 17B, 18A, and 18B are described in relation to a method, it will be appreciated that the structures disclosed in FIGS. 11-16, 17A, 17B, 18A, and 18B are not limited to such a method, but instead may stand alone as structures independent of the method.

Figure 11:
FIGS. 11-16, 17A, 17B, 18A, and 18B illustrate a series of cross-sectional views of some embodiments of a method for forming an IC in which a bottom gate FeFET or an MFM structure comprises a stacked memory structure.

As illustrated by the cross-sectional view 1100 of FIG. 11, a substrate 202 is provided. In some embodiments, the substrate 202 comprises a semiconductor substrate and a dielectric layer covering the semiconductor substrate. The semiconductor substrate may, for example, be or comprise a silicon substrate, a silicon-on-insulator (SOI) substrate, a polymer substrate, or some other suitable type of semiconductor substrate. In some embodiments, the substrate 202 is as described with regard to FIG. 2.

Also illustrated by the cross-sectional view 1100 of FIG. 11, a bottom electrode 204 is formed over the substrate 202. A process for forming the bottom electrode 204 may be or comprise depositing the bottom electrode 204 by direct current (DC) sputtering, physical vapor deposition (PVD), chemical vapor deposition (CVD), atomic layer deposition (ALD), some other suitable deposition process, or any combination of the foregoing. In some embodiments, the bottom electrode 204 is or comprises titanium nitride (e.g., TiN), some other suitable metal(s), or any alloy or combination of the foregoing. In some embodiments, the bottom electrode 204 has a thickness of about 15-500 nanometers or some other suitable thickness. In some embodiments, the bottom electrode 204 is as described with regard to FIG. 2.

Figure 12:
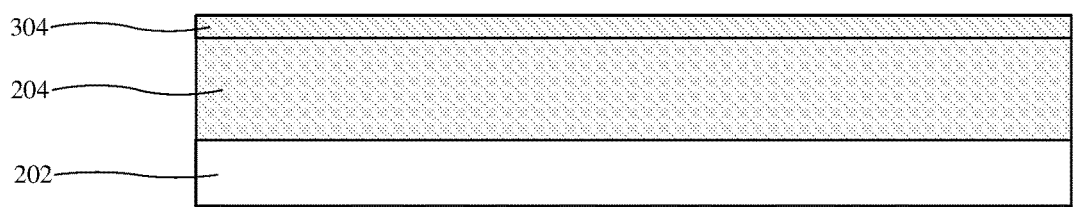

As illustrated by the cross-sectional view 1200 of FIG. 12, a bottom buffer layer 304 is formed over the bottom electrode 204. The bottom buffer layer 304 may, for example, be configured to reduce stress between the bottom electrode 204 and subsequently formed layers to prevent delamination and/or other failure. The stress may, for example, be caused by different coefficients of thermal expansion between the bottom electrode 204 and the subsequently formed layers. A process for forming the bottom buffer layer 304 may, for example, be or comprise depositing by CVD, PVD, ALD, pulsed laser deposition (PLD), some other suitable deposition process, or any combination of the foregoing.

In some embodiments, the bottom buffer layer 304 has a thickness of about 0.5-5.0 nanometers or some other suitable value. In some embodiments, the bottom buffer layer 304 is or comprises aluminum oxide (e.g., $Al_2O_3$), tantalum oxide (e.g., $Ta_2O_5$), some other suitable material(s), or any combination of the foregoing. In some embodiments, the bottom buffer layer 304 is as described with regard to FIG. 3B.

Figure 13:
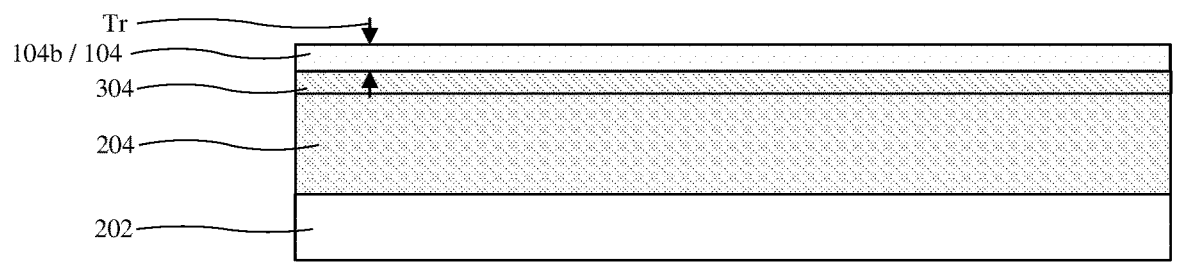

As illustrated by the cross-sectional view 1300 of FIG. 13, a bottom restoration layer 104b is formed over the bottom buffer layer 304. The bottom restoration layer 104b has a crystalline lattice dominated by the orthorhombic phase, such that the crystalline lattice of a subsequently deposited ferroelectric layer epitaxially grows from the bottom restoration layer 104b with the orthorhombic phase dominating. This, in turn, may inhibit the monoclinic phase. Hence, the bottom restoration layer 104b serves as a seed layer for the subsequently deposited ferroelectric layer. In some embodiments, the bottom restoration layer 104b is single crystalline and/or quasi-single crystalline. By promoting the orthorhombic phase and/or inhibiting the monoclinic phase, the bottom restoration layer 104b increases the remanent polarization of the subsequently deposited ferroelectric layer and hence increases the remanent polarization of a stacked ferroelectric structure being formed on the bottom electrode 204.

In some embodiments, the bottom restoration layer 104b is crystalline zirconium oxide ($ZrO_2$), whereas the bottom ferroelectric layer 106b is or comprises hafnium zirconium oxide (e.g., HfZrO). Other suitable materials are, however, amenable in alternative embodiments. In some embodiments, the bottom restoration layer 104b has a thickness Tr of about 0.1-5.0 nanometers, about 1-2 nanometers, or some other suitable value. In some embodiments, the bottom restoration layer 104b is as described with regard to FIG. 3C.

In some embodiments, a process for forming the bottom restoration layer 104b is or comprises depositing the bottom restoration layer 104b by ALD and/or some other suitable deposition process. The ALD may, for example, be performed at about 300-800 degrees Celsius, about 300-550 degrees Celsius, about 550-800 degrees Celsius, or some other suitable temperature. In some embodiments, the process further comprises in-situ thermal annealing to enhance crystallinity of the bottom restoration layer 104b. By in-situ, it is meant that the thermal annealing is performed in a same process chamber that the bottom restoration layer 104b is deposited in without moving the substrate 202 between the depositing and the annealing. The in-situ thermal annealing may, for example, be performed at about 400-700 degrees Celsius or some other suitable temperature, and/or may, for example, be performed for about 1-5 minutes or some other suitable amount of time. Further, the in-situ thermal annealing may, for example, be performed by substrate heating, by infrared heating with heaters at sidewalls of a process chamber, or by some other suitable type of heating.

Figure 14:
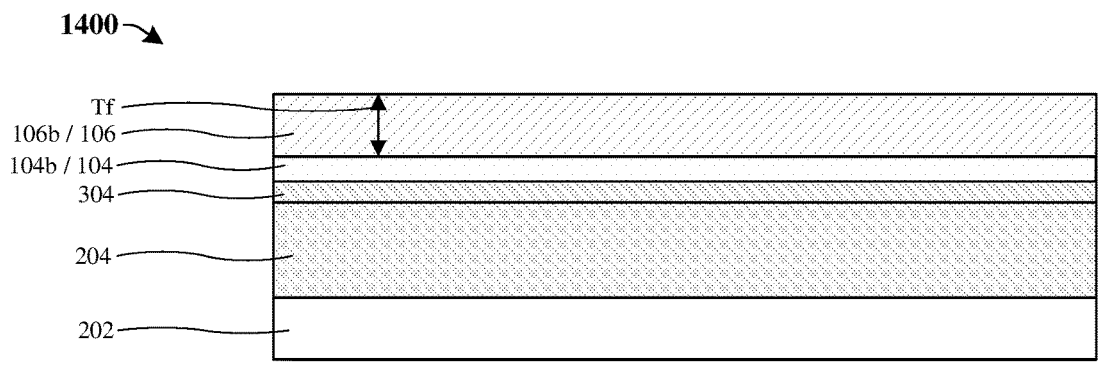

As illustrated by the cross-sectional view 1400 of FIG. 14, a bottom ferroelectric layer 106b is formed over the bottom restoration layer 104b. The bottom ferroelectric layer 106b is polycrystalline and has a plurality of crystalline phases. Further, the orthorhombic phase dominates amongst the plurality of crystalline phases. The orthorhombic phase, but not other phases, exhibits remanent polarization. Therefore, because the orthorhombic phase dominates, the bottom ferroelectric layer 106b has a remanent polarization.

The bottom ferroelectric layer 106b is formed to a thickness Tf less than a critical thickness. The critical thicknesses correspond to thicknesses at or above which the orthorhombic phase becomes thermodynamically unstable and other phases dominate. Thermodynamic instability may, for example, arise due to crystalline grain sizes exceeding a critical grain size. Because other phases do no exhibit polarization, the bottom ferroelectric layer 106b has low or non-existent remanent polarizations above the critical thickness.

In some embodiments, the bottom ferroelectric layer 106b is or comprises hafnium zirconium oxide and/or is doped with aluminum (e.g., Al), silicon (e.g., Si), lanthanum (e.g., La), scandium (e.g., Sc), calcium (e.g., Ca), barium (e.g., Ba), gadolinium (e.g., Gd), yttrium (e.g., Y), strontium (e.g., Sr), some other suitable element(s), or any combination of the foregoing to increase remanent polarization. In some embodiments, the bottom ferroelectric layer 106b has a thickness Tf of about 1-40 nanometers, about 1-20 nanometers, about 20-30 nanometers, about 20-40 nanometers, or some other suitable value. In some embodiments, the bottom ferroelectric layer 106b is as the ferroelectric layers 106 of FIG. 1 are described.

In some first embodiments, a process for forming the bottom ferroelectric layer 106b comprises depositing the bottom ferroelectric layer 106b as an amorphous layer and then crystallizing the bottom ferroelectric layer 106b with a thermal anneal. The thermal anneal may, for example, be performed at about 300-800 degrees Celsius or some other suitable temperature. In some second embodiments, the process for forming the bottom ferroelectric layer 106b comprises depositing the bottom ferroelectric layer 106b crystallized. The depositing for the first and/or second embodiments may, for example, be or comprise ALD and/or some other suitable deposition process. The ALD may, for example, be performed at or above about 300 degrees Celsius or at some other suitable temperature.

Figure 15:
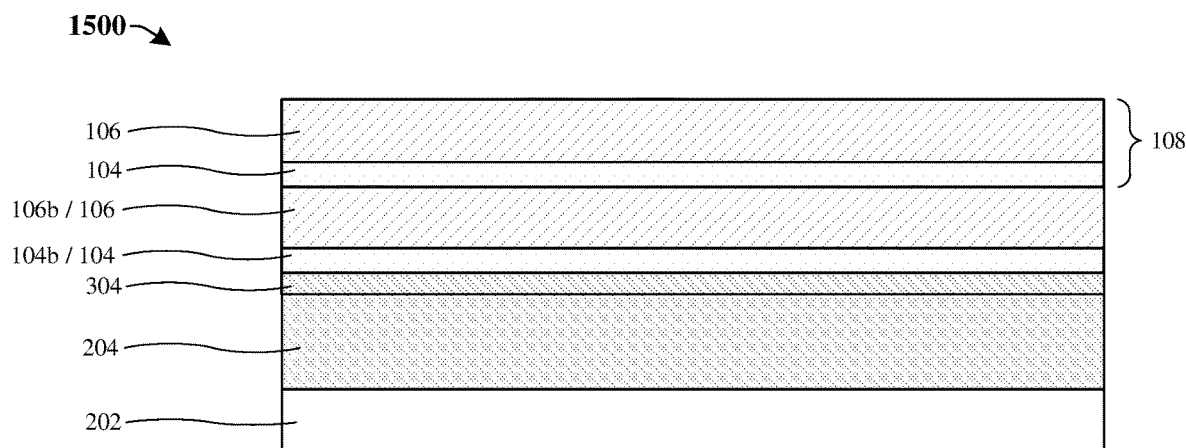

As illustrated by the cross-sectional view 1500 of FIG. 15, the acts at FIGS. 13 and 14 are repeated one or more times to form one or more ferroelectric-layer-restoration-layer pairs 108 stacked over the bottom ferroelectric layer 106b. As a result, a plurality of ferroelectric layers 106 and a plurality of restoration layers 104 are alternatingly stacked in a periodic pattern over the bottom buffer layer 304. The ferroelectric layers 106 include the bottom ferroelectric layer 106b, and the restoration layers 104 include the bottom restoration layer 104b.

Figure 16:
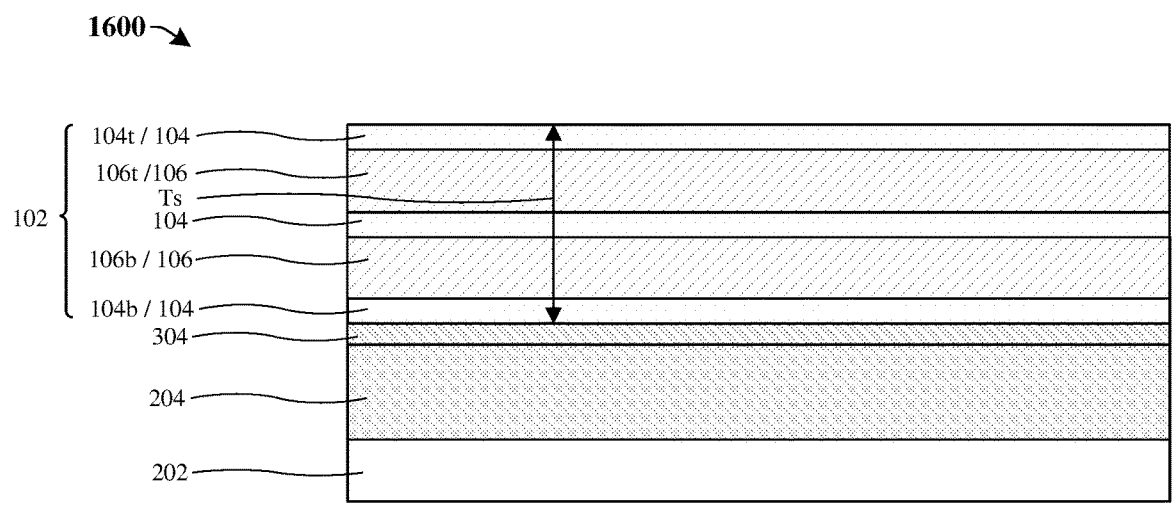

As illustrated by the cross-sectional view 1600 of FIG. 16, the acts at FIG. 13 are repeated to form a top restoration layer 104t over the ferroelectric layer 106. The top restoration layer 104t is as the bottom restoration layer 104b is described with regard to FIG. 13 and adds to the plurality of restoration layers 104. Additionally, or alternatively, the top restoration layer 104t is as described with regard to FIG. 3D. Collectively, the restoration layers 104 and the ferroelectric layers 106 form or otherwise define a stacked ferroelectric structure 102.

In some embodiments, the top restoration layer 104t enhances a remanent polarization of the stacked ferroelectric structure 102. For example, the top restoration layer 104t may have a crystalline lattice that stabilizes a crystalline lattice of a top ferroelectric layer 106t immediately underlying the top restoration layer 104t. This may prevent thermodynamic instability in the orthorhombic phase of the top ferroelectric layer 106t during thermal processing performed hereafter and may therefore preserve the orthorhombic phase.

Because the ferroelectric layers 106 have individual remanent polarizations and are stacked, the individual remanent polarization are additive. Hence, the stacked ferroelectric structure 102 has a remanent polarization that is a combination of the of the individual remanent polarizations. Further, by appropriately biasing the stacked ferroelectric structure 102, the remanent polarization may be changed between a first state and a second state. Because the remanent polarization may be electrically measured, the remanent polarization may be employed to represent a bit of data. For example, the first state may represent a binary "1", whereas the second state may represent a binary "0", or vice versa. Further, the larger the difference (e.g., 2Pr) in remanent polarization between the first state and the second state, the larger the memory read window and hence the more resilient memory read operations are. Because it is the orthorhombic phase that exhibits remanent polarization, increasing the ratio of the orthorhombic phase to other phases may increase the polarization difference. However, adjusting the polarization difference by the ratio is challenging. Thickness may therefore be used to increase the polarization difference.

As described above, the orthorhombic phase becomes thermodynamically unstable when the individual thicknesses of the ferroelectric layers 106 are at or above the individual critical thicknesses, such that the ferroelectric layers 106 lose remanent polarization or have low remanent polarizations. Therefore, if the stacked ferroelectric structure 102 was limited to any one of the ferroelectric layers 106, the stacked ferroelectric structure 102 would itself have a limited thickness. However, because of the restoration layers 104, the stacked ferroelectric structure 102 may have a thickness Ts in excess of the individual critical thicknesses without causing thermodynamic instability and losing remanent polarization.

The restoration layers 104 provide breaks between crystalline lattices of bordering ferroelectric layers 106. As such, the crystalline lattices of bordering ferroelectric layers 106 are not continuations of each other and hence the ratios of the orthorhombic phase to other phases in the bordering ferroelectric layers 106 are not affected by the individual thicknesses of each other. Put another way, the restoration layers 104 confine the individual thicknesses of the ferroelectric layers 106 so the individual thicknesses do not exceed individual critical thicknesses.

Because of the restoration layers 104, the ferroelectric layers 106 may be formed vertically stacked and may each be formed with individual thicknesses up to the individual critical thicknesses without regard for each other. This, in turn, allows the thickness of the stacked ferroelectric structure 102 to be increased beyond the individual critical thicknesses of the ferroelectric layers 106 by increasing the number of ferroelectric layers 106 and the number of restoration layers 104. Hence, the stacked ferroelectric structure 102 may have a larger difference (e.g., 2Pr) in remanent polarization between the first state and the second state than would otherwise be possible without the restoration layers 104.

While the restoration layers 104 are described as having crystalline lattices dominated by the orthorhombic phase, one, some, or all of the restoration layers 104 may be amorphous and/or have some other suitable ratio of crystalline phases in alternative embodiments. For example, the bottom restoration layer 104b and/or the top restoration layer 104t may be single crystalline or quasi-single crystalline, whereas a remainder of the restoration layers 104 may be amorphous and/or heterogenous. Further, while the restoration layers 104 are described as seed layers, one, some, or all of the restoration layers 104 may not be seed layers in alternative embodiments. For example, the bottom restoration layer 104b may be a seed layer, whereas a remainder of the restoration layers 104 may not be seed layer. A seed layer may, for example, be regarded as a layer having a crystalline lattice that promotes or otherwise seeds growth of a crystalline lattice in a layer subsequently deposited directly on the seed layer.

While the ferroelectric layers 106 are described as being separately formed, the ferroelectric layers 106 may share a thermal anneal in some embodiments. For example, the ferroelectric layers 106 may all be deposited in an amorphous state and then may undergo a common thermal anneal for crystallization. As described above, the thermal anneal may, for example, be performed at about 300-800 degrees Celsius or some other suitable temperature.

While FIGS. 13-16 describe some embodiments of a process for forming the stacked ferroelectric structure 102, alternative embodiments are amenable. In some alternative embodiments, a process for forming the stacked ferroelectric structure 102 comprises: 1) alternatingly depositing the restoration layers 104 and the ferroelectric layers 106, where the restoration layers 104 are deposited as single crystal or quasi-single crystalline layers and the ferroelectric layers 106 are deposited as amorphous layers; and 2) then performing a common thermal anneal to crystallize the ferroelectric layers 106. In some alternative embodiments, the process for forming the stacked ferroelectric comprises: 1) depositing the bottom restoration layer 104b as a single crystal or quasi-single layer; and 2) then alternatingly depositing a remainder of the restoration layers 104 and the ferroelectric layers 106, where the remainder of the restoration layers 104 are deposited as amorphous and/or heterogeneous layers and the ferroelectric layers 106 are deposited as crystalline layers. In some alternative embodiments, the process for forming the stacked ferroelectric comprises: 1) depositing the bottom restoration layer 104b as a single crystal or quasi-single layer; 2) then alternatingly depositing a remainder of the restoration layers 104, except the top restoration layer 104t, and the ferroelectric layers 106, where the remainder of the restoration layers 104 are deposited as amorphous and/or heterogeneous layers and the ferroelectric layers 106 are deposited as crystalline layers; and 3) then depositing the top restoration layer 104t as a single crystal or quasi-single layer.

Figure 17A:
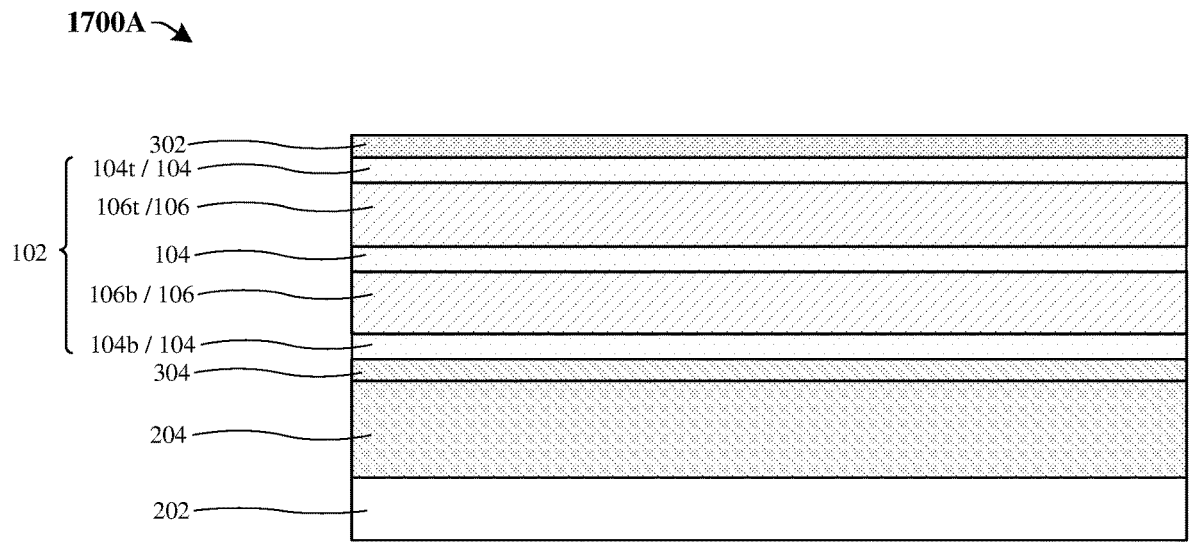
Figure 17B:
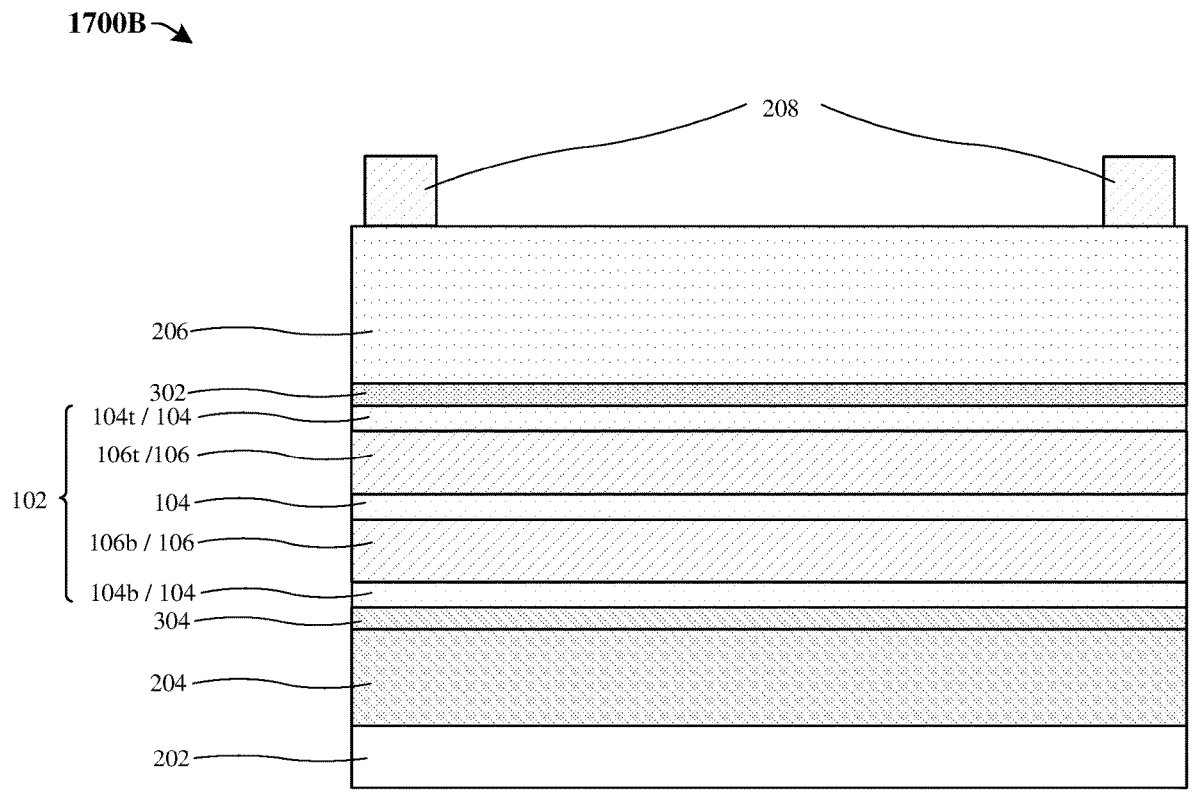
Figure 18A:
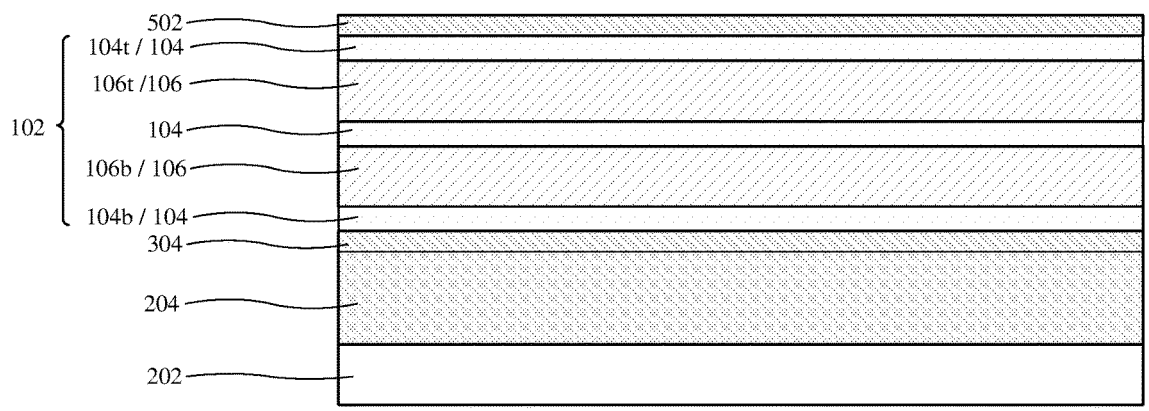
Figure 18B:
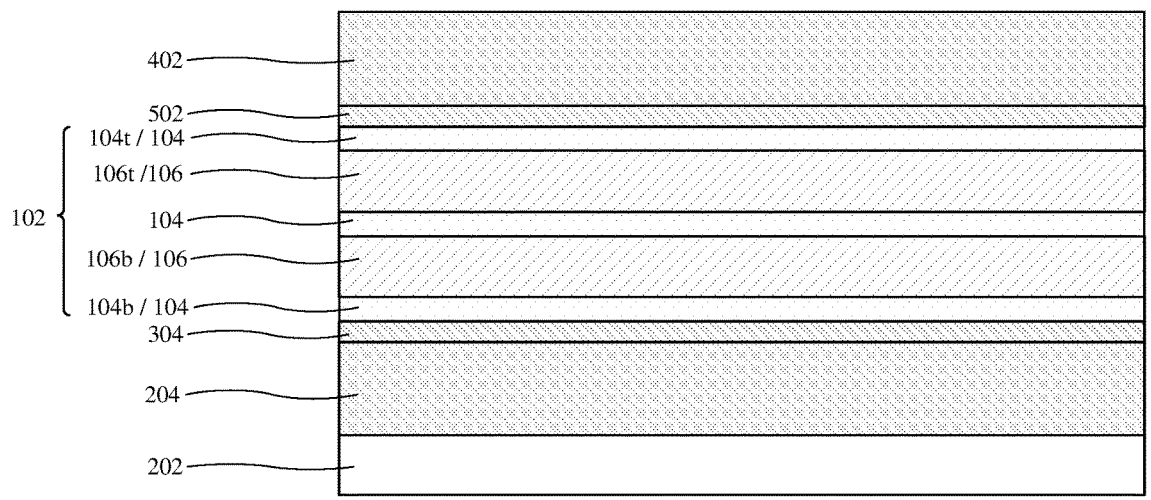

Proceeding from FIG. 16, a bottom gate FeFET structure or a MFM structure may be formed as described hereafter. In some embodiments, the acts described hereafter with regard to FIGS. 17A and 17B are performed following from FIG. 16, and the acts described hereafter with regard to FIGS. 18A and 18B are skipped, to form the bottom gate FeFET structure. The bottom gate FeFET structure may, for example, be as described with regard to FIG. 3G. In some embodiments, the acts described hereafter with regard to FIGS. 18A and 18B are performed following from FIG. 16, and the acts described hereafter with regard to FIGS. 17A and 17B are skipped, to form the MFM structure. The MFM structure may, for example, be as described with regard to FIG. 5C.

As illustrated by the cross-sectional view 1700A of FIG. 17A, a channel-bottom blocking layer 302 is formed over the stacked ferroelectric structure 102 of FIG. 16. As explained in greater detail hereafter, the channel-bottom blocking layer 302 inhibits oxygen vacancies and/or leakage current at a subsequently formed semiconductor channel layer to enhance performance. A process for forming the channel-bottom blocking layer 302 may, for example, be or comprise depositing the channel-bottom blocking layer 302. The depositing may, for example, be performed by CVD, PVD, ALD, some other suitable deposition process, or any combination of the foregoing. In some embodiments, the process further comprises doping the channel-bottom blocking layer 302 concurrently with or after the depositing.

In some embodiments, the channel-bottom blocking layer 302 has a thickness of about 0.1 to 10 nanometers or some other suitable value. In some embodiments, the channel-bottom blocking layer 302 is or comprises a bulk material with or without dopants. The bulk material may, for example, be or comprise hafnium oxide (e.g., $HfO_2$), tantalum oxide (e.g., $Ta_2O_5$), some other suitable material, or any combination of the foregoing. The dopants may, for example, be or comprise silicon (e.g., Si), magnesium (e.g., Mg), aluminum (e.g., Al), yttrium oxide (e.g., $Y_2O_3$), lanthanum (e.g., La), strontium (e.g., Sr), gadolinium (e.g., Gd), nitrogen (e.g., N), scandium (e.g., Sc), calcium (e.g., Ca), some other suitable material, or any combination of the foregoing. In some embodiments, the channel-bottom blocking layer 302 is as described with regard to FIG. 3A.

As illustrated by the cross-sectional view 1700B of FIG. 17B, a semiconductor channel layer 206 and a pair of source/drain contacts 208 are formed over the channel-bottom blocking layer 302. The semiconductor channel layer 206 overlies the channel-bottom blocking layer 302, and the source/drain contacts 208 overlie the semiconductor channel layer 206 respectively on opposite sides of the semiconductor channel layer 206. A process for forming the semiconductor channel layer 206 may, for example, be or comprise depositing the semiconductor channel layer 206 by CVD, PVD, ALD, or some suitable process.

In some embodiments, the semiconductor channel layer 206 is or comprises amorphous Indium-Gallium-Zinc-Oxide (a-IGZO) and/or some other suitable material, and/or has a thickness of about 10 nanometers or some other suitable value. In some embodiments, the source/drain contacts 208 are or comprise copper, gold, some other suitable conductive material(s), or any combination of the foregoing. In some embodiments, the semiconductor channel layer 206 and/or the source/drain contacts 208 is/are as described with regard to FIG. 2.

During operation of the bottom gate FeFET, the semiconductor channel layer 206 selectively conducts depending upon whether the bottom electrode 204 is biased with a voltage in excess of a threshold voltage. Further, the threshold voltage changes between states depending on the remanent polarization state of the stacked ferroelectric structure 102, such that the semiconductor channel layer 206 conducts based on the remanent polarization state if the bottom electrode 204 is biased with a voltage between the threshold voltage states.

The channel-bottom blocking layer 302 inhibits oxygen vacancies at the semiconductor channel layer 206. The reduced oxygen vacancies, in turn, inhibit scattering of current in the semiconductor channel layer 206 and/or reduce reliability issues from negative bias temperature instability and positive bias temperature instability. Further, the channel-bottom blocking layer 302 reduces leakage current at semiconductor channel layer 206.

The channel-bottom blocking layer 302 has smaller valence band than the semiconductor channel layer 206 and has a large valence band offset relative to the semiconductor channel layer 206 to reduce hole leakage current. Additionally, or alternatively, the channel-bottom blocking layer 302 has higher conduction band than the semiconductor channel layer 206 and has a large conduction band offset relative to the semiconductor channel layer 206 to reduce electron leakage current. The large valence band offset is a valence band offset greater than that between the semiconductor channel layer 206 and the top restoration layer 104t. The large conduction band offset is a conduction band offset greater than that between the semiconductor channel layer 206 and the top restoration layer 104t.

In alternative embodiments of the method described by FIGS. 11-16, 17A, and 17B, the acts described with regard to FIG. 12, the acts described with regard to FIG. 13, the acts described with regard to FIG. 16, the acts described with regard to FIG. 17A, or any combination of the foregoing acts are omitted. For example, the acts described with regard to FIG. 12 may be omitted in alternative embodiments, such that the bottom buffer layer 304 is not formed.

Focusing on the MFM structure, and as illustrated by the cross-sectional view 1800A of FIG. 18A, a top buffer layer 502 is formed over the stacked ferroelectric structure 102 of FIG. 16. The top buffer layer 502 may, for example, be configured to reduce stress between the stacked ferroelectric structure 102 and subsequently formed layers to prevent delamination and/or other failure. The stress may, for example, be caused by different coefficients of thermal expansion between the stacked ferroelectric structure 102 and the subsequently formed layers. A process for forming the top buffer layer 502 may, for example, be or comprise depositing by CVD, PVD, ALD, PLD, some other suitable deposition process, or any combination of the foregoing.

In some embodiments, the top buffer layer 502 has a thickness of about 0.5-5.0 nanometers or some other suitable value. In some embodiments, the top buffer layer 502 is or comprises aluminum oxide (e.g., $Al_2O_3$), tantalum oxide (e.g., $Ta_2O_5$), some other suitable material(s), or any combination of the foregoing. In some embodiments, the top buffer layer 502 is as described with regard to FIG. 5A.

As illustrated by the cross-sectional view 1800B of FIG. 18B, a top electrode 402 is formed over the top buffer layer 502. In some embodiments, the bottom electrode 204 is or comprises titanium nitride (e.g., TiN), some other suitable metal(s), or any alloy or combination of the foregoing. In some embodiments, the bottom electrode 204 has a thickness of about 100 nanometers, about 15-500 nanometers, or some other suitable thickness. In some embodiments, the top electrode 402 is as described with regard to FIG. 4.

A process for forming the top electrode 402 may be or comprise depositing the top electrode 402 by DC sputtering, PVD, CVD, ALD, some other suitable deposition process, or any combination of the foregoing. Further, the process may, for example, comprise annealing. The annealing may, for example, be performed at about 400-900 degrees Celsius to reduce stress and/or enhance crystallinity of the ferroelectric layers 106. Further, the annealing may, for example, be performed in an atmosphere comprising nitrogen gas (e.g., $N_2$), argon gas, oxygen gas (e.g., 02), some other suitable gas, or any combination of the foregoing.

In alternative embodiments of the method described by FIGS. 11-16, 18A, and 18B, the acts described with regard to FIG. 12, the acts described with regard to FIG. 13, the acts described with regard to FIG. 16, the acts described with regard to FIG. 18A, or any combination of the foregoing acts are omitted. For example, the acts described with regard to FIG. 18A may be omitted in alternative embodiments, such that the top buffer layer 502 is not formed.

Figure 19:
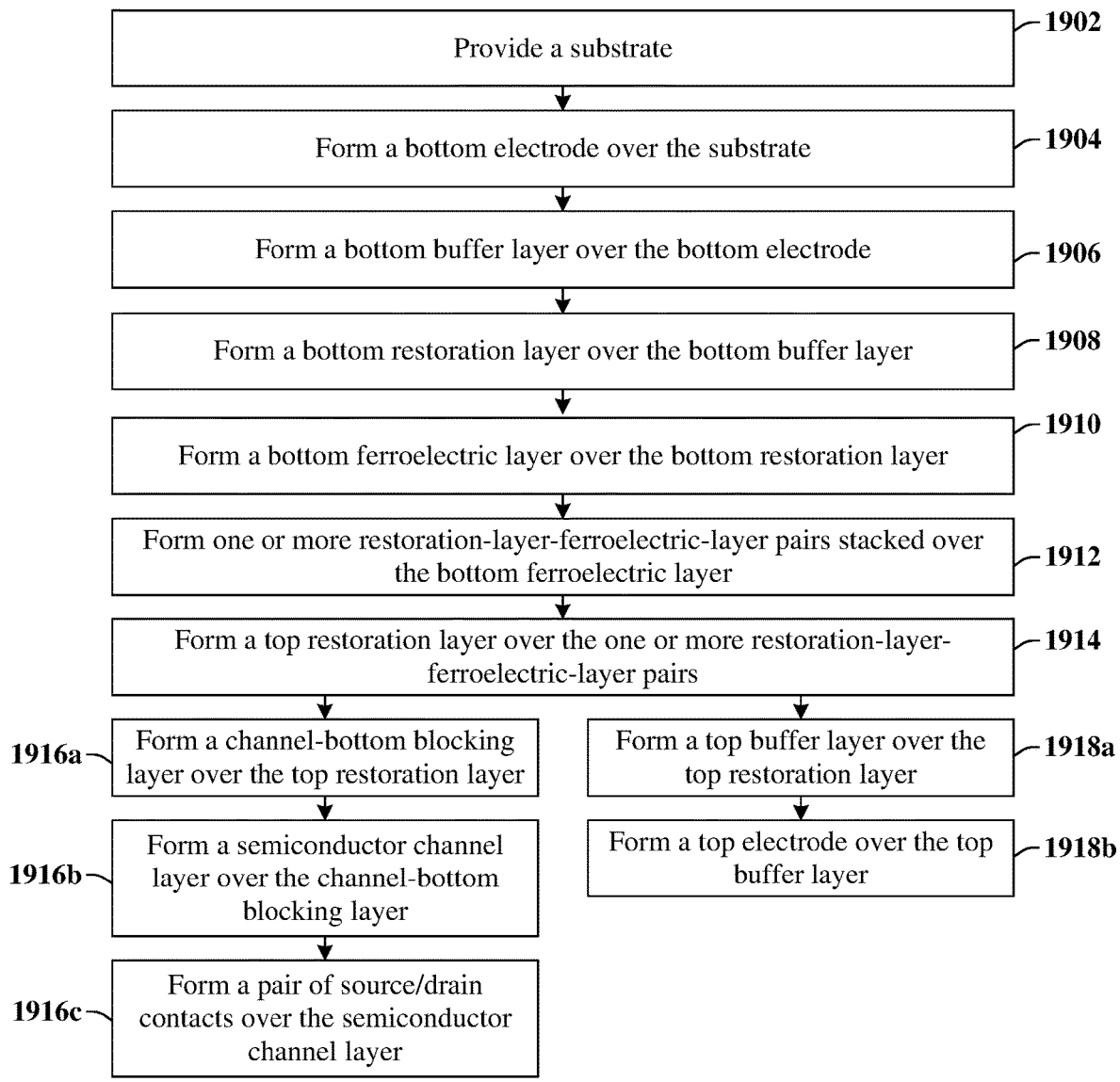
FIG. 19 illustrates a block diagram of some embodiments of the method of FIGS. 11-16, 17A, 17B, 18A, and 18B.

With respect to FIG. 19, a flowchart 1900 of some embodiments of the method of FIGS. 11-16, 17A, 17B, 18A, and 18B is provided.

At 1902, a substrate is provided. See, for example, FIG. 11.

At 1904, a bottom electrode is formed over the substrate. See, for example, FIG. 11.

At 1906, a bottom buffer layer is formed over the bottom electrode. See, for example, FIG. 12.

At 1908, a bottom restoration layer is formed over the bottom buffer layer. See, for example, FIG. 13.

At 1910, a bottom ferroelectric layer is formed over the bottom restoration layer. See, for example, FIG. 14.

At 1912, one or more restoration-layer-ferroelectric-layer pairs are formed stacked over the bottom ferroelectric layer. See, for example, FIG. 15.

At 1914, a top restoration layer is formed over the one or more restoration-layer-ferroelectric-layer pairs. See, for example, FIG. 16.

In some embodiments, the acts at 1916a-1916c are performed, proceeding from 1914, to form a bottom gate FeFET structure. At 1916a, a channel-bottom blocking layer is formed over the top restoration layer. See, for example, FIG. 17A. At 1916b, a semiconductor channel layer is formed over the channel-bottom blocking layer. See, for example, FIG. 17B. At 1916c, a pair of source/drain contacts is formed over the semiconductor channel layer. See, for example, FIG. 17B.

In some embodiments, the acts at 1918a and 1919b are performed, proceeding from 1914, to form a MFM structure. At 1918a, a top buffer layer is formed over the top restoration layer. See, for example, FIG. 18A. At 1918b, a top electrode is formed over the top buffer layer. See, for example, FIG. 18B.

While flowchart 1900 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

With reference to FIGS. 20-24, a series of cross-sectional views 2000-2400 of some embodiments of a method for forming an IC in which a top gate FeFET structure comprises a stacked memory structure is provided. The top gate FeFET structure may, for example, be as described with regard to FIG. 8D. Although FIGS. 20-24 are described in relation to a method, it will be appreciated that the structures disclosed in FIGS. 20-24 are not limited to such a method, but instead may stand alone as structures independent of the method.

Figure 20:
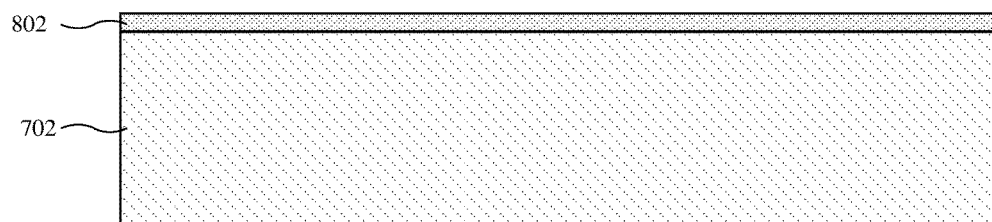
FIGS. 20-24 illustrate a series of cross-sectional views of some embodiments of a method for forming an IC in which a top gate FeFET structure comprises a stacked memory structure.

As illustrated by the cross-sectional view 2000 of FIG. 20, a semiconductor substrate 702 is provided. The semiconductor substrate 702 may, for example, be or comprise a silicon substrate, a silicon-on-insulator (SOI) substrate, a polymer substrate, or some other suitable type of semiconductor substrate. In some embodiments, the semiconductor substrate 702 is as described with regard to FIG. 7.

Also illustrated by the cross-sectional view 2000 of FIG. 20, a channel-top blocking layer 802 is formed over the semiconductor substrate 702. The channel-top blocking layer 802 inhibits oxygen vacancies and/or leakage current at a channel region hereafter formed in the semiconductor substrate 702. A process for forming the channel-top blocking layer 802 may, for example, be or comprise depositing the channel-top blocking layer 802. The depositing may, for example, be performed by CVD, PVD, ALD, some other suitable deposition process, or any combination of the foregoing. In some embodiments, the process further comprises doping the channel-top blocking layer 802 concurrently with or after the depositing.

In some embodiments, the channel-top blocking layer 802 has a thickness of about 0.1 to 10 nanometers or some other suitable value. In some embodiments, the channel-top blocking layer 802 is or comprises a bulk material with or without dopants. The bulk material may, for example, be or comprise hafnium oxide (e.g., $HfO_2$), tantalum oxide (e.g., $Ta_2O_5$), some other suitable material, or any combination of the foregoing. The dopants may, for example, be or comprise silicon (e.g., Si) and/or some other suitable material. In some embodiments, the channel-top blocking layer 802 is as described with regard to FIG. 8B.

Figure 21:
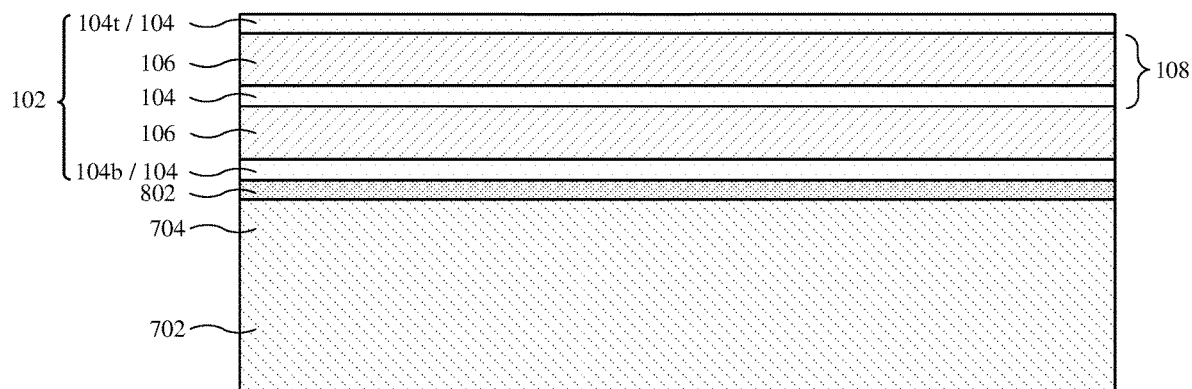

As illustrated by the cross-sectional view 2100 of FIG. 21, the acts described with regard to FIG. 13-16 are performed to form a stacked ferroelectric structure 102 over the channel-top blocking layer 802. A bottom restoration layer 104b is formed over the channel-top blocking layer 802 as described with regard to FIG. 13. A bottom ferroelectric layer 106b is formed over the bottom restoration layer 104b as described with regard to FIG. 14. The acts at FIGS. 13 and 14 are repeated one or more times to form one or more ferroelectric-layer-restoration-layer pairs 108 stacked over the bottom ferroelectric layer 106b as described with regard to FIG. 15. The acts at FIG. 13 are repeated to form a top restoration layer 104t over the one or more ferroelectric-layer-restoration-layer pairs 108 as described with regard to FIG. 16.

Figure 22:
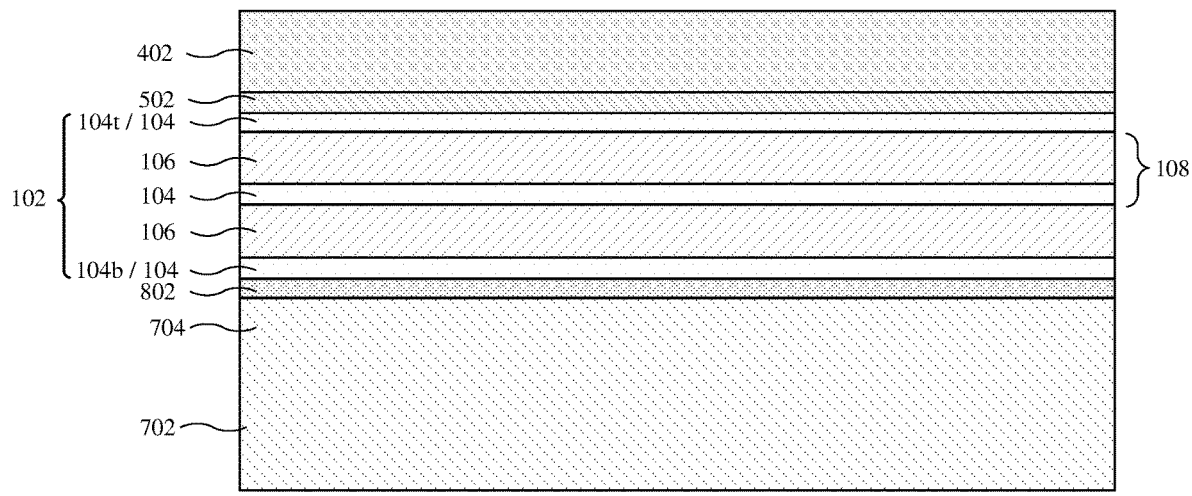

As illustrated by the cross-sectional view 2200 of FIG. 22, the acts described with regard to FIGS. 18A and 18B are performed. A top buffer layer 502 is formed over the stacked ferroelectric structure 102 as described with regard FIG. 18A. A top electrode 402 is formed over the top buffer layer 502 as described with regard to FIG. 18B.

Figure 23:
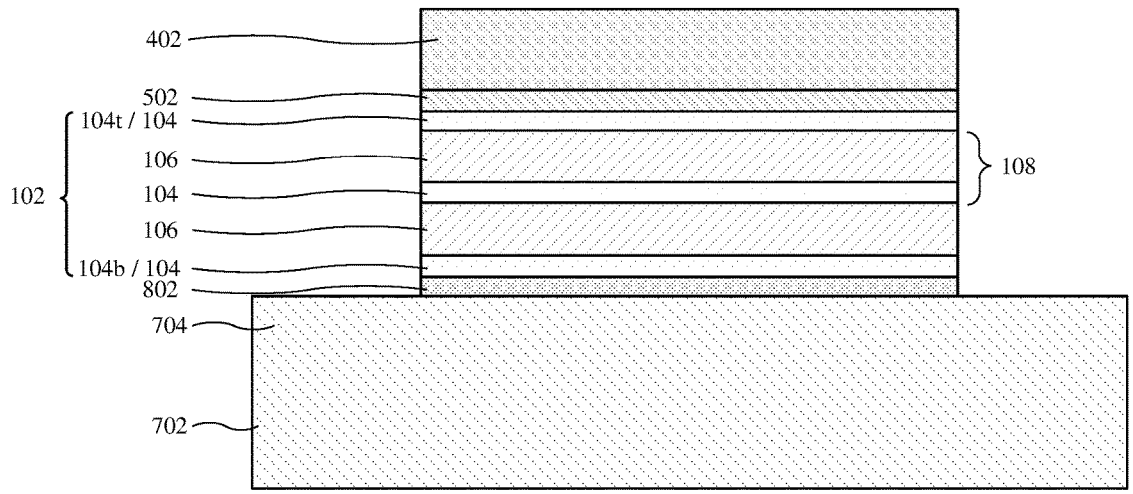

As illustrated by the cross-sectional view 2300 of FIG. 23, the channel-top blocking layer 802, the stacked ferroelectric structure 102, the top buffer layer 502, and the top electrode 402 are patterned to define a columnar gate stack. The patterning may, for example, be performed by a photolithography/etching process and/or by some other suitable process. In some embodiments, the patterning comprises: forming a hard mask (not shown) over the top electrode 402 using a photolithography/etching process; and subsequently etching the channel-top blocking layer 802, the stacked ferroelectric structure 102, the top buffer layer 502, and the top electrode 402 with the hard mask in place.

Figure 24:
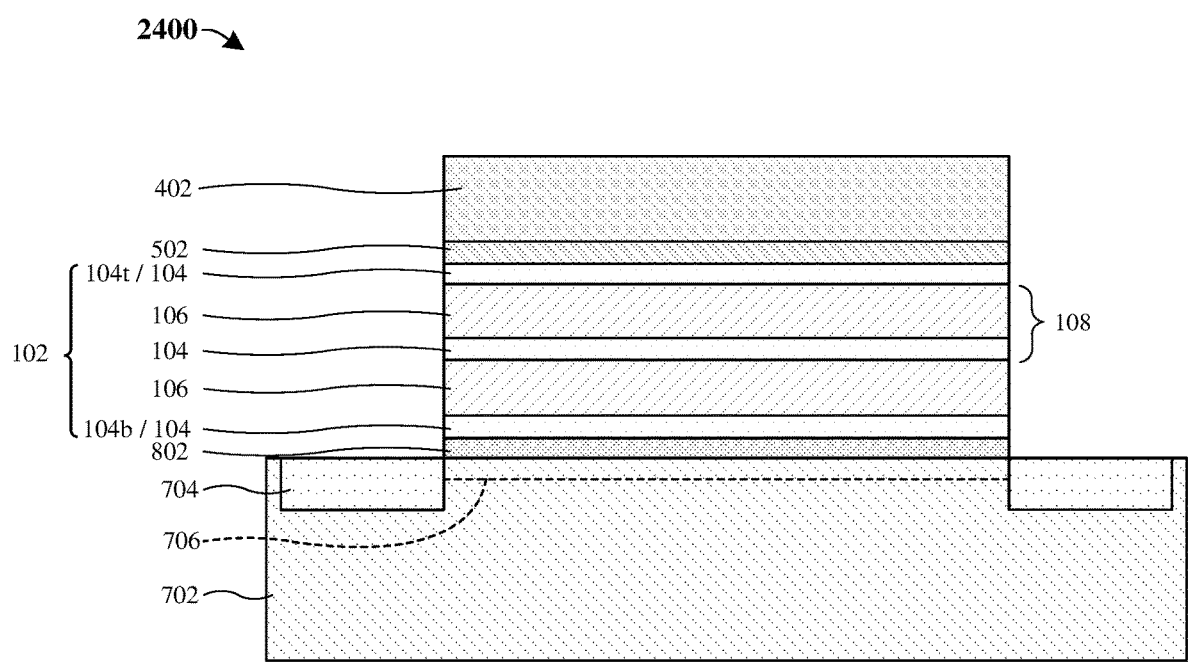

As illustrated by the cross-sectional view 2400 of FIG. 24, the semiconductor substrate 702 is doped to form a pair of source/drain regions 704 in the semiconductor substrate 702. The source/drain regions 704 are respectively on opposite sides of the columnar gate stack and demarcate a channel region 706 underlying the columnar gate stack. The doping may, for example, be performed by ion implantation and/or some other suitable doping process.

During operation of the top gate FeFET structure, the channel region 706 selectively conducts depending upon whether the top electrode 402 is biased with a voltage in excess of a threshold voltage. Further, the threshold voltage changes between states depending on the remanent polarization state of the stacked ferroelectric structure 102, such that the channel region 706 conducts based on the remanent polarization state if the top electrode 402 is biased with a voltage between the threshold voltage states.

The channel-top blocking layer 802 inhibits oxygen vacancies at the channel region 706. The reduced oxygen vacancies, in turn, inhibit scattering of current in the channel region 706 and/or reduce reliability issues from negative bias temperature instability and positive bias temperature instability. Further, the channel-top blocking layer 802 reduces leakage current at the channel region 706. The channel-top blocking layer 802 has smaller valence band than the channel region 706 and has a large valence band offset relative to the channel region 706 to reduce hole leakage current. Additionally, or alternatively, the channel-top blocking layer 802 has higher conduction band than the channel region 706 and has a large conduction band offset relative to the channel region 706 to reduce electron leakage current. The large valence band offset is a valence band offset greater than that between the channel region 706 and the bottom restoration layer 104*b*. The large conduction band offset is a conduction band offset greater than that between the channel region 706 and the bottom restoration layer 104*b*.

In alternative embodiments of the method described by FIGS. 20-24, the bottom buffer layer 304, the bottom restoration layer 104*b*, the top restoration layer 104*t*, the channel-top blocking layer 802, or any combination of the foregoing is/are not formed. For example, the channel-top blocking layer 802 may not be formed at FIG. 20.

Figure 25:
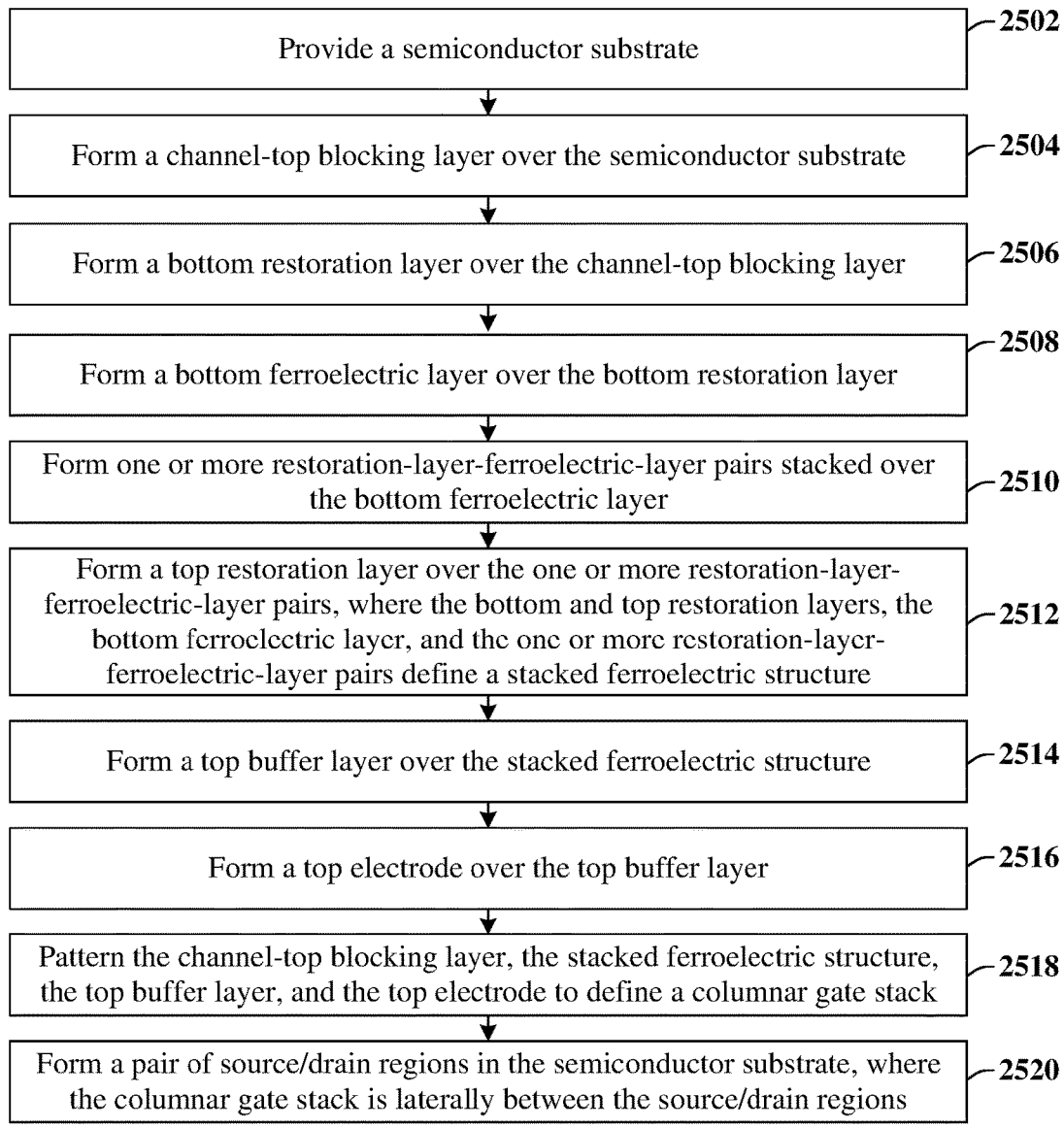
FIG. 25 illustrates a block diagram of some embodiments of the method of FIGS. 20-24.

With respect to FIG. 25, a flowchart 2500 of some embodiments of the method of FIGS. 20-24 is provided.

At 2502, a semiconductor substrate is provided. See, for example, FIG. 20.

At 2504, a channel-top blocking layer is formed over the semiconductor substrate. See, for example, FIG. 20.

At 2506, a bottom restoration layer is formed over the channel-top blocking layer. See, for example, FIG. 21.

At 2508, a bottom ferroelectric layer is formed over the bottom restoration layer. See, for example, FIG. 21.

At 2510, one or more restoration-layer-ferroelectric-layer pairs are formed stacked over the bottom ferroelectric layer. See, for example, FIG. 21.

At 2512, a top restoration layer is formed over the one or more restoration-layer-ferroelectric-layer pairs, where the bottom and top restoration layers, the bottom ferroelectric layer, and the one or more restoration-layer-ferroelectric-layer pairs define a stacked ferroelectric structure. See, for example, FIG. 21.

At 2514, a top buffer layer is formed over the top restoration layer. See, for example, FIG. 22.

At 2516, a top electrode is formed over the top buffer layer. See, for example, FIG. 22.

At 2518, the channel-top blocking layer, the stacked ferroelectric structure, the top buffer layer, and the top electrode are patterned to define a columnar gate stack. See, for example, FIG. 23.

At 2520, a pair of source/drain regions is formed in the semiconductor substrate, where the columnar gate stack is laterally between the source/drain regions. See, for example, FIG. 24.

While flowchart 2500 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

With reference to FIGS. 26-31, a series of cross-sectional views 2600-3100 of some embodiments of a method for forming an IC in which a dual gate FeFET structure comprises a stacked memory structure is provided. The dual gate FeFET structure may, for example, be as described with regard to FIG. 10A. Although FIGS. 26-31 are described in relation to a method, it will be appreciated that the structures disclosed in FIGS. 26-31 are not limited to such a method, but instead may stand alone as structures independent of the method.

Figure 26:
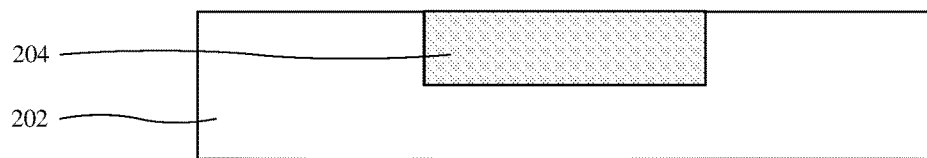
FIGS. 26-31 illustrate a series of cross-sectional views of some embodiments of a method for forming an IC in which a dual gate FeFET structure comprises a stacked memory structure.

As illustrated by the cross-sectional view 2600 of FIG. 26, a substrate 202 is provided. In some embodiments, the substrate 202 comprises a semiconductor substrate and a dielectric layer covering the semiconductor substrate. The semiconductor substrate may, for example, be or comprise a silicon substrate, a silicon-on-insulator (SOI) substrate, a polymer substrate, or some other suitable type of semiconductor substrate. In some embodiments, the substrate 202 is as described with regard to FIG. 2.

Also illustrated by the cross-sectional view 2600 of FIG. 26, a bottom electrode 204 is formed over, and inset into, the substrate 202. In some embodiments, the bottom electrode 204 has a smaller coefficient of thermal expansion as the substrate 202 and/or subsequently formed layers. In some embodiments, the bottom electrode 204 is or comprises titanium nitride (e.g., TiN), some other suitable metal(s), or any alloy or combination of the foregoing. In some embodiments, the bottom electrode 204 has a thickness of about 15-500 nanometers or some other suitable thickness. In some embodiments, the bottom electrode 204 is as described with regard to FIG. 2.

A process for forming the bottom electrode 204 may be or comprise: patterning the substrate 202 to form an opening in a top of the substrate 202; depositing the bottom electrode 204 covering the substrate 202 and filling the opening; and performing a planarization into the bottom electrode 204 to localize the bottom electrode 204 to the opening. The depositing may, for example, be performed DC sputtering, PVD, CVD, ALD, some other suitable deposition process, or any combination of the foregoing.

Figure 27:
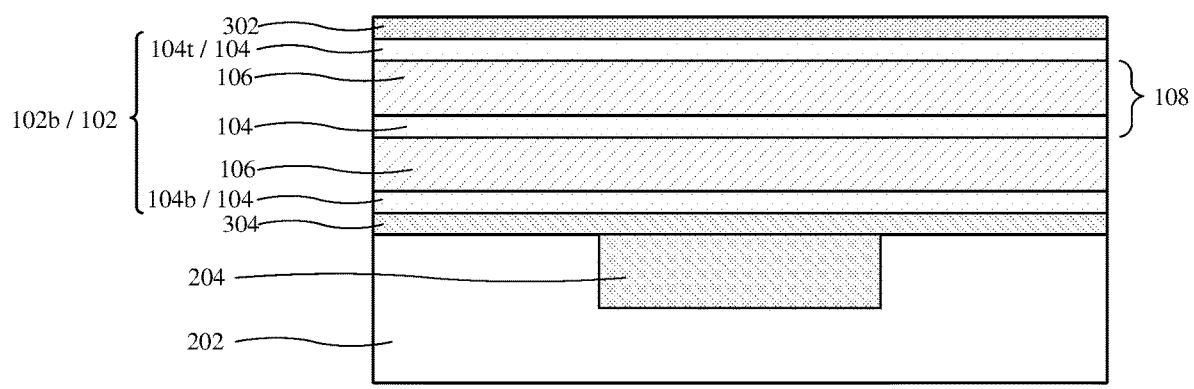

As illustrated by the cross-sectional view 2700 of FIG. 27, the acts described with regard to FIGS. 12-16 and 17A are performed. A bottom buffer layer 304 is formed over the bottom electrode 204 as described with regard to FIG. 12. A stacked ferroelectric structure 102, which is hereafter more specifically referred to as a bottom stacked ferroelectric structure 102*b*, is formed over the bottom buffer layer 304 as described with regard to FIGS. 13-16. A channel-bottom blocking layer 302 is formed over the bottom stacked ferroelectric structure 102*b* as described with regard to FIG. 17A.

Figure 28:
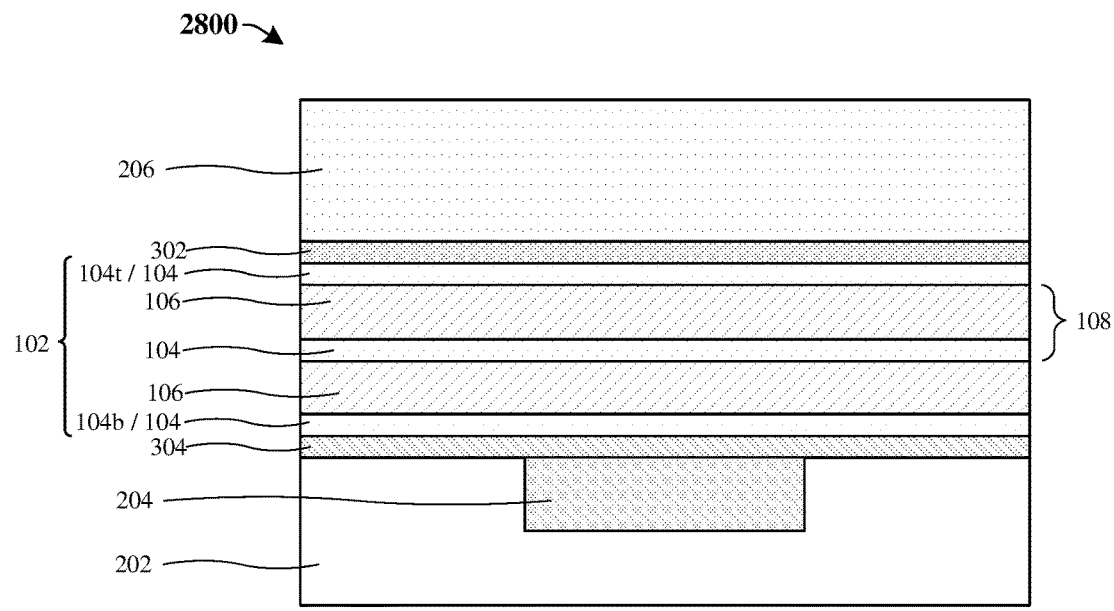

As illustrated by the cross-sectional view 2800 of FIG. 28, a semiconductor channel layer 206 is formed the channel-bottom blocking layer 302. A process for forming the semiconductor channel layer 206 may, for example, be or comprise depositing the semiconductor channel layer 206 by CVD, PVD, ALD, or some suitable process.

In some embodiments, the semiconductor channel layer 206 is or comprises amorphous Indium-Gallium-Zinc-Oxide (a-IGZO) and/or some other suitable material. In some embodiments, the semiconductor channel layer 206 has a thickness of about 10 nanometers or some other suitable value. In some embodiments, the semiconductor channel layer 206 is as described with regard to FIG. 2.

Figure 29:
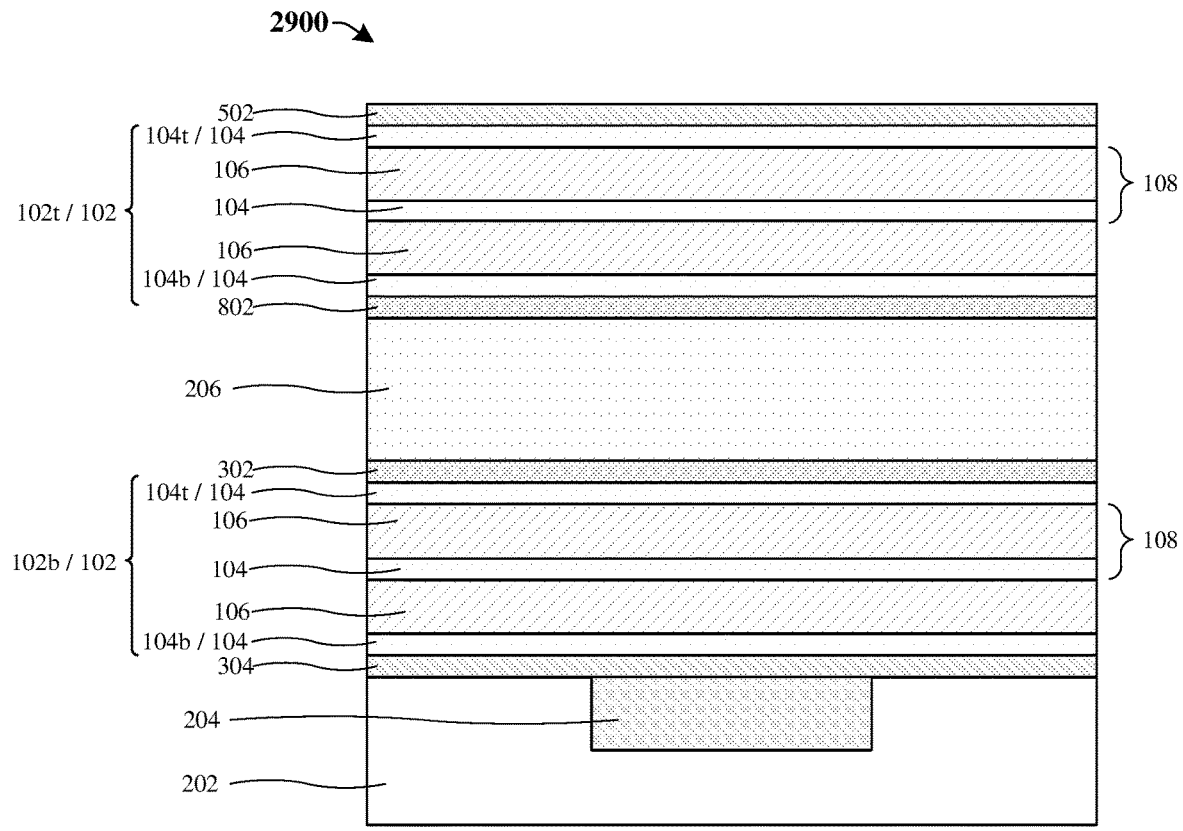

As illustrated by the cross-sectional view 2900 of FIG. 29, acts described with regard to FIGS. 20, 13-16, and 18A are performed. A channel-top blocking layer 802 is formed over the semiconductor channel layer 206 as described with regard to FIG. 20. A stacked ferroelectric structure 102, which is hereafter more specifically referred to as a top stacked ferroelectric structure 102*t*, is formed over the channel-top blocking layer 802 as described with regard to FIGS. 13-16. A top buffer layer 502 is formed over the top stacked ferroelectric structure 102*t* as described with regard FIG. 18A.

Figure 30:
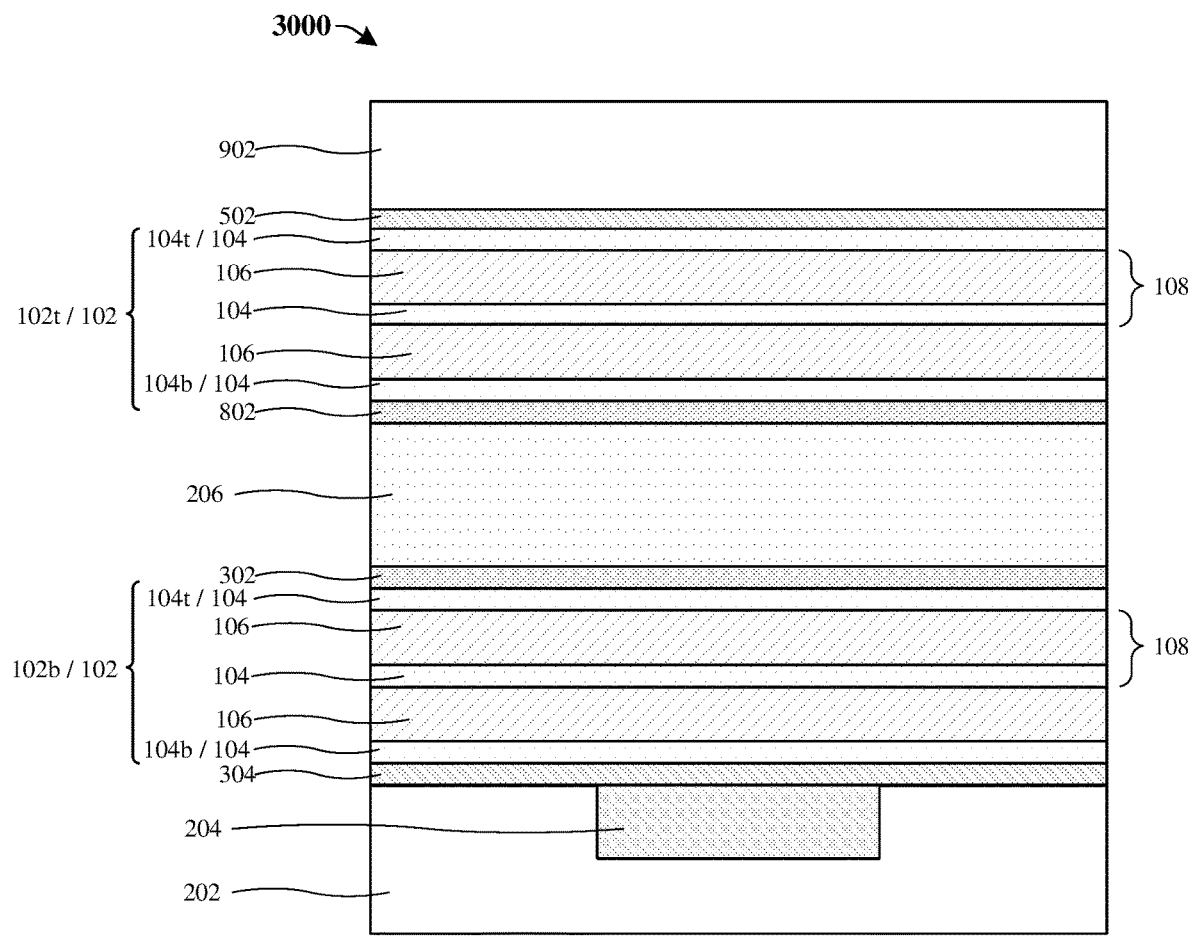

As illustrated by the cross-sectional view 3000 of FIG. 30, a passivation layer 902 is formed over the top buffer layer 502. In some embodiments, the passivation layer 902 is or comprises silicon oxide and/or some other suitable dielectric (s). In some embodiments, the passivation layer 902 is as described with regard to FIG. 9. As process for forming the passivation layer 902 may, for example, be or comprise depositing the passivation layer 902 by CVD, PVD, ALD, some other suitable deposition process, or any combination of the foregoing.

Figure 31:
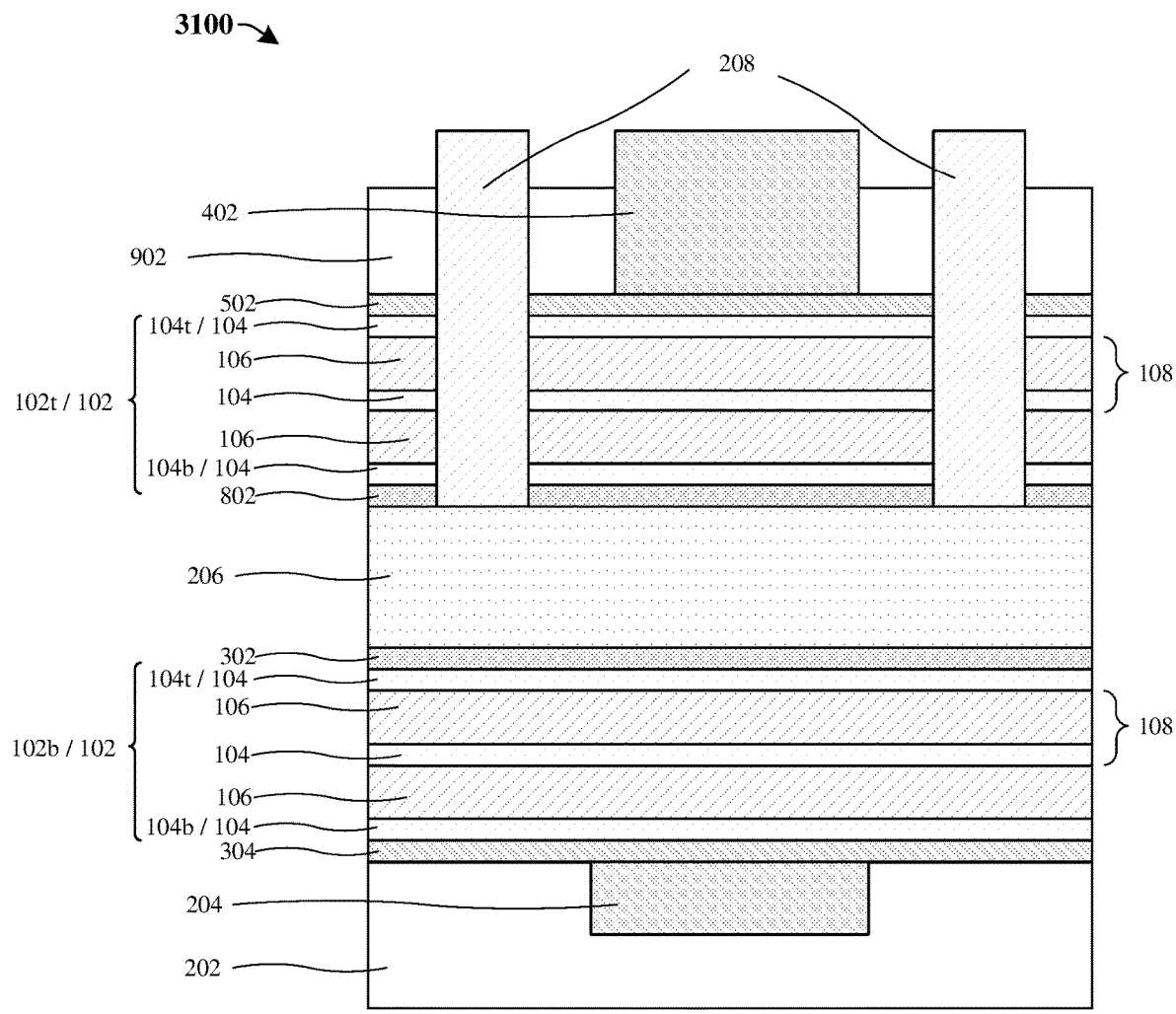

As illustrated by the cross-sectional view 3100 of FIG. 31, a top electrode 402 and a pair of source/drain contacts 208 are formed over the top buffer layer 502. The top electrode 402 extends through the passivation layer 902 to the top buffer layer 502. The source/drain contacts 208 are respectively on opposite sides of the top electrode 402 and extend through the passivation layer 902 to the semiconductor channel layer 206.

A process for forming the top electrode 402 and the source/drain contacts 208 may, for example, comprise: 1) patterning the passivation layer 902 and other layers between the passivation layer 902 and the semiconductor channel layer 206 to form openings corresponding to the top electrode 402 and the source/drain contacts 208; and 2) subsequently filling the openings. Other suitable processes are, however, amenable. The filling may, for example, comprise deposition by DC sputtering, PVD, CVD, ALD, some other suitable deposition process, or any combination of the foregoing. Further, the filling may, for example, comprise annealing.

In some embodiments, the top electrode 402 is or comprises titanium nitride (e.g., TiN), some other suitable metal (s), or any alloy or combination of the foregoing. In some embodiments, the top electrode 402 has a thickness of about 100 nanometers, about 15-500 nanometers, or some other suitable thickness. In some embodiments, the source/drain contacts 208 are or comprise copper, gold, some other suitable conductive material(s), or any combination of the foregoing. In some embodiments, the top electrode 402 and/or the source/drain contacts 208 is/are as described with regard to FIG. 9.

In alternative embodiments of the method described by FIGS. 26-31, the bottom buffer layer 304, the bottom restoration layer 104*b* of the bottom stacked ferroelectric structure 102*b*, the top restoration layer 104*t* of the bottom stacked ferroelectric structure 102*b*, the channel-bottom blocking layer 302, the top buffer layer 502, the bottom restoration layer 104*b* of the top stacked ferroelectric structure 102*t*, the top restoration layer 104*t* of the top stacked ferroelectric structure 102*t*, the channel-top blocking layer 802, or any combination of the foregoing is/are not formed.

Figure 32:
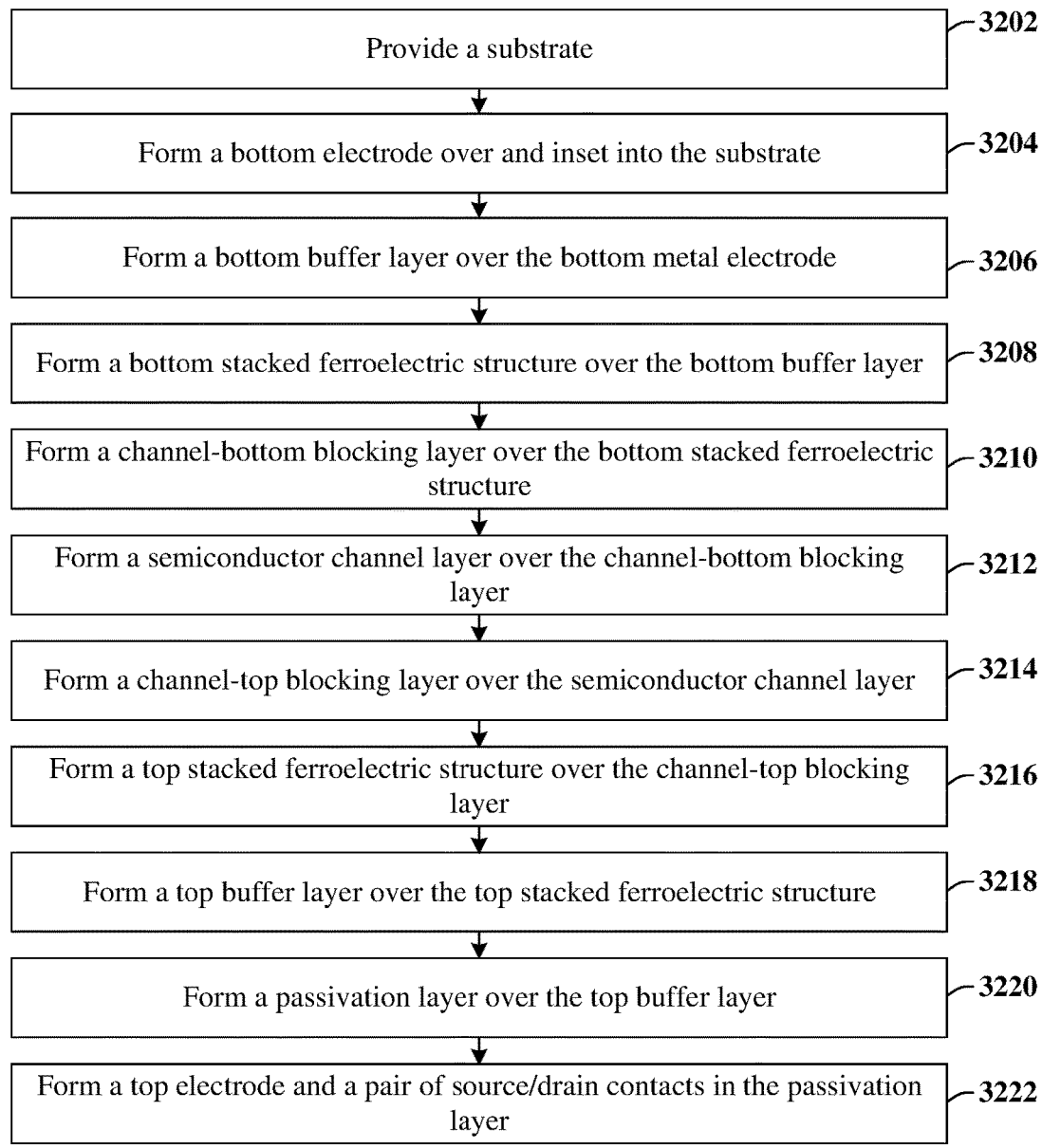
FIG. 32 illustrates a block diagram of some embodiments of the method of FIGS. 26-31.

With respect to FIG. 32, a flowchart 3200 of some embodiments of the method of FIGS. 26-31 is provided.

At 3202, a substrate is provided. See, for example, FIG. 26.

At 3204, a bottom electrode is formed over and inset into the substrate. See, for example, FIG. 26.

At 3206, a bottom buffer layer is formed over the bottom electrode. See, for example, FIG. 27.

At 3208, a bottom stacked ferroelectric structure is formed over the bottom buffer layer. See, for example, FIG. 27.

At 3210, a channel-bottom blocking layer is formed over the bottom stacked ferroelectric structure. See, for example, FIG. 27.

At 3212, a semiconductor channel layer is formed over the channel-bottom blocking layer. See, for example, FIG. 28.

At 3214, a channel-top blocking layer is formed over the semiconductor channel layer. See, for example, FIG. 29.

At 3216, a top stacked ferroelectric structure is formed over the channel-top blocking layer. See, for example, FIG. 29.

At 3218, a top buffer layer is formed over the top stacked ferroelectric structure. See, for example, FIG. 29.

At 3220, a passivation layer is formed over the top buffer layer. See, for example, FIG. 30.

At 3222, a top electrode and a pair of source/drain contacts are formed in the passivation layer. See, for example, FIG. 31.

While flowchart 3200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated circuit (IC) comprising:
   depositing a first ferroelectric layer over a substrate, wherein the first ferroelectric layer comprises a first material type;
   depositing a first restoration layer overlying the first ferroelectric layer and comprising a second material type different than the first material type; and
   depositing a second ferroelectric layer overlying the first restoration layer;
   wherein the first and second ferroelectric layers and the first restoration layer define a memory structure, wherein the first and second ferroelectric layers comprise a plurality of crystalline phases after the depositing of the second ferroelectric layer, and wherein an orthorhombic phase is a majority phase amongst the plurality of crystalline phases.

2. The method of claim 1, wherein the first and second ferroelectric layers are amorphous at deposition, wherein the first restoration layer is crystalline at deposition, and wherein the method further comprises:

annealing the first and second ferroelectric layers to crystallize the first and second ferroelectric layers after the depositing of the second ferroelectric layer.

3. The method of claim 1, wherein the first and second ferroelectric layers are crystalline at deposition, and wherein the first restoration layer is amorphous at deposition.

4. The method of claim 1, wherein the first and second ferroelectric layers are crystalline at deposition, and wherein the method further comprises:
depositing a second restoration layer over the substrate, wherein the second restoration layer is single crystalline in the orthorhombic phase;
wherein the first ferroelectric layer is deposited on the second restoration layer, and wherein crystallization of the first ferroelectric layer is seeded by the second restoration layer at deposition.

5. The method of claim 1, further comprising:
forming a gate electrode overlying the second ferroelectric layer; and
forming a pair of source/drain electrodes overlying the substrate respectively on opposite sides of the gate electrode.

6. The method of claim 5, further comprising:
depositing a semiconductor channel layer overlying the substrate, wherein the first ferroelectric layer is deposited overlying the semiconductor channel layer, and wherein the source/drain electrodes are deposited overlying the semiconductor channel layer.

7. The method of claim 1, further comprising:
forming a gate electrode overlying and recessed into a top of the substrate, wherein the first ferroelectric layer is deposited overlying the gate electrode;
depositing a semiconductor channel layer overlying the second ferroelectric layer; and
forming a pair of source/drain electrodes overlying the semiconductor channel layer respectively on opposite sides of the gate electrode.

8. A method for forming a memory structure, comprising:
depositing a semiconductor channel layer over a substrate;
forming a ferroelectric structure over the substrate, wherein the forming of the ferroelectric structure comprises:
depositing a first ferroelectric layer;
depositing a first restoration layer overlying the first ferroelectric layer; and
depositing a second ferroelectric layer overlying the first restoration layer;
forming a gate electrode over the substrate; and
forming a pair of source/drain regions over the substrate, respectively on opposite sides of the gate electrode;
wherein the semiconductor channel layer, the ferroelectric structure, and the gate electrode are formed vertical stacked with the ferroelectric structure between the semiconductor channel layer and the gate electrode, and
wherein the first and second ferroelectric layers have a plurality of crystalline phases and a critical thickness at which a majority phase of the plurality of crystalline phases changes from an orthorhombic phase to a tetragonal and/or monoclinic phase, and further have individual thicknesses less than the critical thickness.

9. The method of claim 8, wherein the first and second ferroelectric layers share a common crystalline lattice, and wherein the first restoration layer is amorphous or has a different crystalline lattice than the common crystalline lattice.

10. The method of claim 8, further comprising:
depositing a blocking layer over the substrate;
wherein the blocking layer, the semiconductor channel layer, and the ferroelectric structure are formed vertically stacked with the blocking layer directly contacting the semiconductor channel layer between the semiconductor channel layer and the ferroelectric structure, and wherein the blocking layer is configured to inhibit oxygen vacancies at an interface between the blocking layer and the semiconductor channel layer.

11. The method of claim 8, wherein the first restoration layer comprises zirconium oxide, and wherein the first and second ferroelectric layers comprise hafnium zirconium oxide.

12. The method of claim 11, wherein a vertical separation between a bottom surface of the first ferroelectric layer and a top surface of the second ferroelectric layer is greater than about 60 nanometers, and wherein the critical thickness is about 30 nanometers.

13. The method of claim 8, wherein the forming of the ferroelectric structure further comprises:
depositing a second restoration layer overlying the second ferroelectric layer at a top surface of the ferroelectric structure, wherein the second restoration layer is configured to stabilize a crystalline lattice of the second ferroelectric layer to prevent thermodynamic instability of an orthorhombic phase of the second ferroelectric layer.

14. The method of claim 13, wherein the forming of the ferroelectric structure further comprises:
depositing a third restoration layer at a bottom surface of the ferroelectric structure, wherein the first ferroelectric layer is deposited overlying the third restoration layer, and wherein the third restoration layer is configured to stabilize a crystalline lattice of the first ferroelectric layer to prevent thermodynamic instability of an orthorhombic phase of the first ferroelectric layer.

15. A method for forming a memory structure, comprising:
depositing an amorphous Indium-Gallium-Zinc-Oxide (a-IGZO) layer over a substrate;
forming a ferroelectric structure over the substrate, wherein the forming of the ferroelectric structure comprises:
depositing a first hafnium zirconium oxide layer;
depositing a first zirconium oxide layer overlying the first hafnium zirconium oxide layer; and
depositing a second hafnium zirconium oxide layer overlying the first zirconium oxide layer;
forming a gate electrode over the substrate; and
forming a pair of source/drain electrodes over the substrate, respectively on opposite sides of the gate electrode;
wherein the a-IGZO layer, the ferroelectric structure, and the gate electrode are formed vertically stacked with the ferroelectric structure between the a-IGZO layer and the gate electrode.

16. The method of claim 15, wherein the first and second hafnium zirconium oxide layers are deposited in one of an amorphous state and a crystalline state, and wherein the first zirconium oxide layer is deposited in another one of the amorphous state and the crystalline state.

17. The method of claim 16, wherein the first and second hafnium zirconium oxide layers are deposited in a crystalline phase, and wherein the method further comprises:

annealing the first and second hafnium zirconium oxide layers to crystallize the first and second hafnium zirconium oxide layers.

18. The method of claim 15, wherein the forming of the ferroelectric structure further comprises:
   depositing a second zirconium oxide layer overlying the second hafnium zirconium oxide layer; and
   depositing a third hafnium zirconium oxide layer overlying the second zirconium oxide layer.

19. The method of claim 15, wherein the first and second hafnium zirconium oxide layers are deposited to a thickness of about 20-30 nanometers, and wherein the first zirconium oxide layer is deposited to a thickness of about 0.1-5.0 nanometers.

20. The method of claim 15, further comprising:
   depositing a silicon doped hafnium oxide layer over the substrate, wherein the a-IGZO layer, the silicon doped hafnium oxide layer, and the ferroelectric structure are formed vertically stacked with the silicon doped hafnium oxide layer directly contacting the a-IGZO layer between the a-IGZO layer and the ferroelectric structure.

* * * * *